(12) United States Patent
Saito et al.

(10) Patent No.: US 8,336,595 B2
(45) Date of Patent: Dec. 25, 2012

(54) TAPE ADHERING APPARATUS AND TAPE ADHERING METHOD

(75) Inventors: Kimikazu Saito, Nagano (JP); Tetsushi Suzuki, Nagano (JP)

(73) Assignee: Tsubaki Seiko Inc., Nagano (JP)

( * ) Notice: Subject to any disclaimer, the term of this patent is extended or adjusted under 35 U.S.C. 154(b) by 103 days.

(21) Appl. No.: 12/606,347

(22) Filed: Oct. 27, 2009

(65) Prior Publication Data

US 2010/0084096 A1    Apr. 8, 2010

Related U.S. Application Data

(63) Continuation of application No. 11/569,471, filed on Nov. 21, 2006, now Pat. No. 7,621,307.

(30) Foreign Application Priority Data

May 25, 2004   (JP) .................................. 2004-154050

(51) Int. Cl.
*C09J 5/00* (2006.01)
*B29C 65/00* (2006.01)
*B32B 38/10* (2006.01)

(52) U.S. Cl. ........ 156/382; 156/154; 156/248; 156/286; 156/312

(58) Field of Classification Search ..................... 156/99, 156/103, 104, 153, 154, 272.2, 273.9, 275.5, 156/285, 286, 312, 381, 382
See application file for complete search history.

(56) References Cited

U.S. PATENT DOCUMENTS

| 3,972,766 | A | * | 8/1976 | Fontvieille | ..................... | 156/358 |
| 5,254,205 | A | * | 10/1993 | Tsutsumi et al. | ............. | 156/538 |
| 5,286,329 | A | * | 2/1994 | Iijima et al. | ................... | 156/297 |
| 5,800,667 | A | * | 9/1998 | Kosaki et al. | ................. | 156/382 |
| 5,908,524 | A | * | 6/1999 | Masui et al. | .................. | 156/212 |
| 6,113,724 | A | | 9/2000 | Ogawa | | |
| 2003/0173017 | A1 | | 9/2003 | Hecht et al. | | |

FOREIGN PATENT DOCUMENTS

| JP | 02-054564 A | | 2/1990 |
| JP | 10025456 A | * | 1/1998 |
| JP | 10-233430 A | | 9/1998 |
| JP | 10233430 A | * | 9/1998 |
| JP | 2000-349047 A | | 12/2000 |
| JP | 2003-007808 A | | 1/2003 |
| JP | 2003007808 A | * | 1/2003 |
| JP | 2005-026377 A | | 1/2005 |
| JP | 2005-129678 A | | 5/2005 |

\* cited by examiner

*Primary Examiner* — Philip Tucker
*Assistant Examiner* — Brian R Slawski
(74) *Attorney, Agent, or Firm* — Cowan, Liebowitz & Latman P.C.; Mark Montague

(57) ABSTRACT

A tape bonding device for bonding a tape member to a work piece, wherein the tape bonding device has a main body section, and a cover body section provided reopenable to the main body section. The main body section has a mount member on the upper surface of which the work piece is mounted; a tape holding unit which holds the tape member in a stretching state, and, at the same time, locates the tape member in the upper portion of the work piece mounted on the mount member; and a sucking unit for vacuum suction of space between the tape member and the work piece. The cover body section has a concave section which is depressed upward in the blocked state of the cover body section, and, at the same time, the upper bottom surface of the concave section presses downward the work piece and the tape member, which move upward.

4 Claims, 10 Drawing Sheets

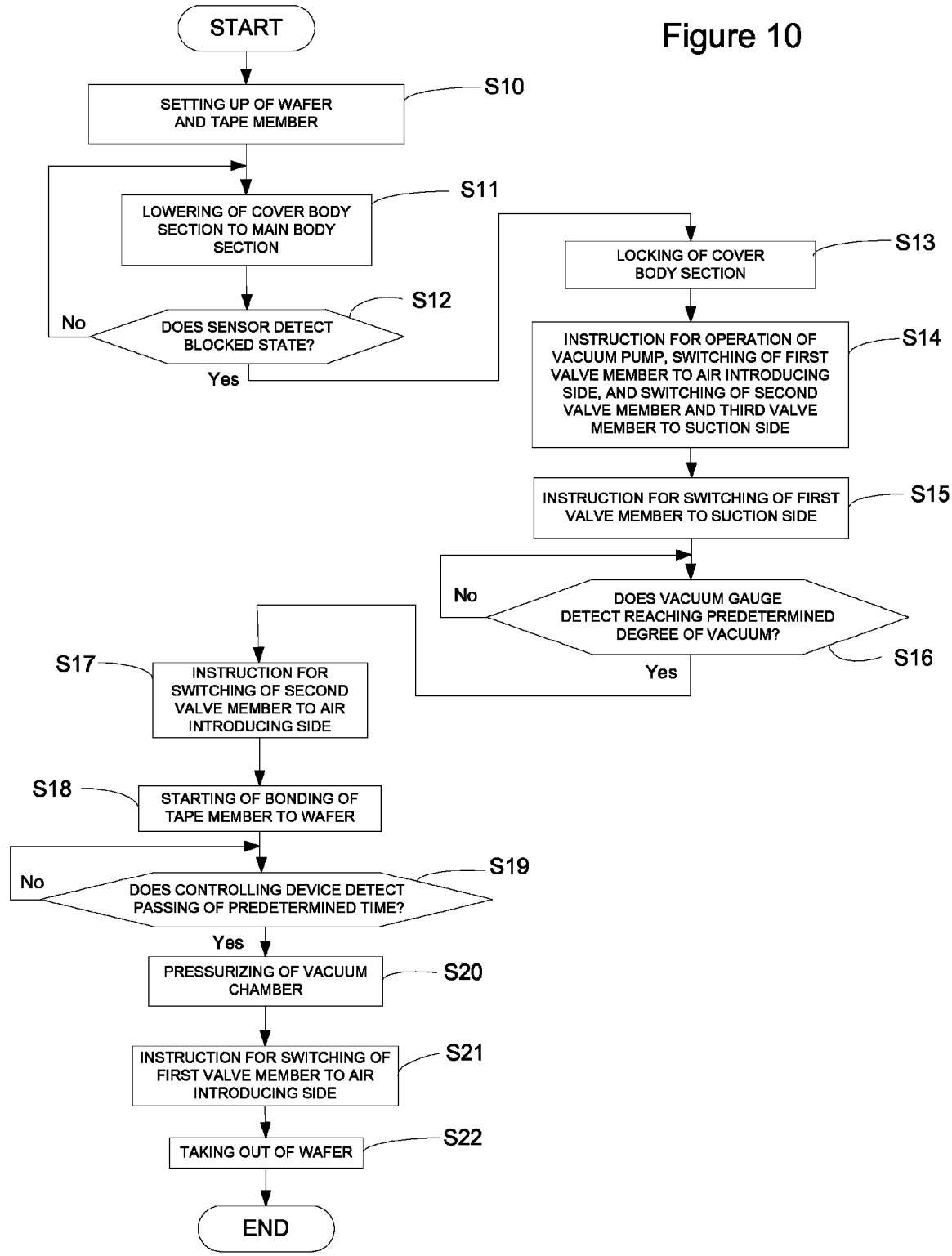

Figure 11a
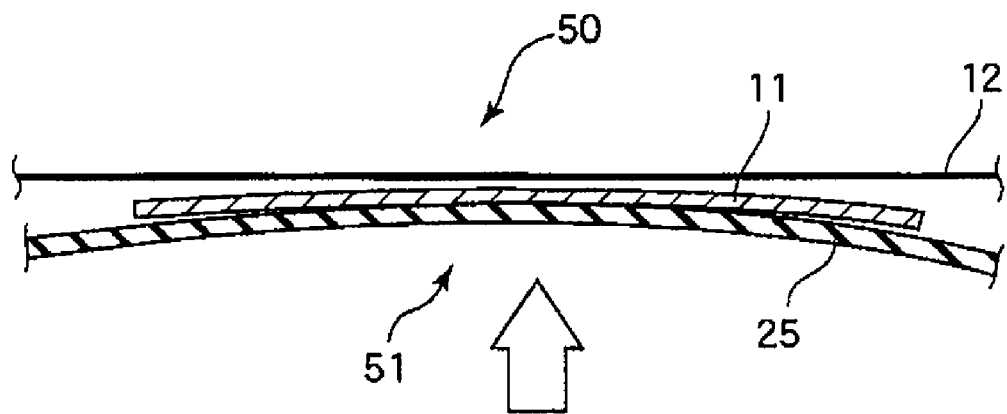
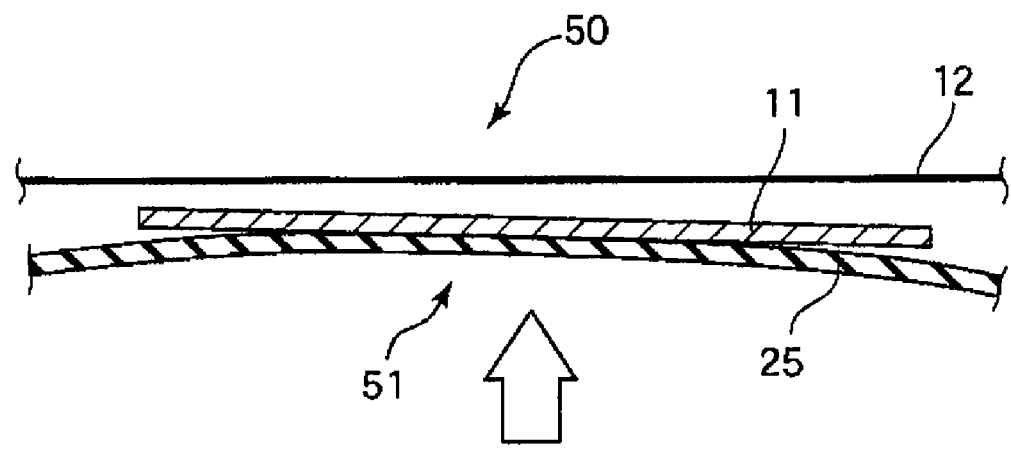
Figure 11b

TAPE ADHERING APPARATUS AND TAPE ADHERING METHOD

REFERENCE TO RELATED APPLICATIONS

This application is a continuation of U.S. patent application Ser. No. 11/569,471, filed Nov. 21, 2006, now U.S. Pat. No. 7,621,307, which is a National Stage of International Application No. PCT/JP2005/007056, filed Apr. 12, 2005, which claims priority to Japanese Patent Application No. 2004-154050, filed May 25, 2004. The disclosures of U.S. patent application Ser. No. 11/569,471 and International Application No. PCT/JP2005/007056 are incorporated herein by reference.

TECHNICAL FIELD

The present invention relates to a device and a method for bonding tape, by which a tape member is bonded to a work piece.

BACKGROUND ART

In some cases, processes for manufacturing a semiconductor includes a process in which formed semiconductor-chips are reduced in size and thickness by polishing the back of a semiconductor wafer (hereinafter, called wafer) for reduction in the thickness of the wafer after forming a circuit pattern on the surface of the wafer. Moreover, there are some cases in which reduction in the thickness of the wafer is realized in a manufacturing process of chemical etching in which liquid chemicals are used.

In the above manufacturing process, protective tape (hereinafter, called a tape member) with an adhesion property is pasted on the surface of the wafer. Thereby, a circuit is prevented from being damaged when the surface of the wafer is contaminated or scratched.

A device for bonding tape which bonds a tape member to the above surface of the wafer has been disclosed in Japanese Laid-Open Patent Application No. 2003-7808 (patent document 1). In the device for bonding tape disclosed in the patent document 1, a state in which both a chamber on the side of a main body and that on the side of an upper cover are evacuated is made to a state in which the pressure of the chamber on the side of the upper cover is switched to the atmospheric one. Thereby, there is caused a pressure difference between the chamber on the side of the upper cover and that on the side of the main body, and a rubber sheet expands into the chamber on the side of the main body by the pressure difference. Then, the rubber sheet pushes the tape member by the above expanding to bond the tape member to the work piece.

Moreover, another pasting device has been disclosed in a patent document 2. In the device disclosed in Japanese Laid-Open Patent Application No. 2000-349047 (patent document 2), the central portion of a base with excellent smoothness is bent toward the side of a tape member, using a pressure difference between a first vacuum chamber and a second vacuum one. While the base with the bent central portion is pressed against the tape member pasted on a wafer in response to the above operation, the wafer is raised by driving an up-and-down device. According to the above configuration, the tape member is bonded to the wafer while air is pushed out to the outside from the side of the central portion of the tape member.

As disclosed herein, Patent Document 1 is Japanese Laid-Open Patent Application No. 2003-7808 (refer to paragraph 0007 and FIG. 2 to FIG. 4); and Patent Document 2 is Japanese Laid-Open Patent Application No. 2000-349047 (refer to abstract and FIG. 1 to FIG. 5).

The configuration disclosed in the above-described patent document 1 has been still at an idea level, and has not taken a concrete form. Therefore, various kinds of problems are caused when an actually concrete form is tried to be given to the above configuration. One example is that considerably large tension is required in order to remove slack by the self weight of the rubber sheet when the sheet is stretched, because the rubber sheet is located in an upper portion in the configuration disclosed in the patent document 1. Consequently, there is a problem that it is difficult to install the rubber sheet.

Especially, a space between the tape member in contact with the rubber sheet and the wafer is usually small, for efficient bonding of the tape member, at an initial position at which bonding operation of the tape member to the wafer is started. In some cases, there is caused a problem that the tape member is bonded to the wafer before a stage for vacuum suction, and bubbles are embedded between the above bonded surfaces when slack is caused in the rubber sheet under a state in which the above space is small.

Moreover, a plurality of set screws are provided, and all these screws are required to be rotated according to the configuration disclosed in the patent document 1, and, when the set screws are required to simultaneously be rotated, it is difficult to execute the required operations. Furthermore, according to the configuration disclosed in the patent document 1, it is required to set up the tape member and the wafer under a state in which the upper cover is removed. Consequently, an excess number of man-hours are required.

Moreover, according to the configuration disclosed in the patent document 2, the base of glass plate and the like are bent, using the pressure difference between the first vacuum chamber and the second vacuum one, the base is bonded to the tape member pasted on the wafer, and, at the same time, the tape member pasted on the wafer and the base are further raised from the above bonded state. Consequently, two stages are required for the bonding process to need more number of man hours, which is not preferable in the view point of the cost. Moreover, as an up-and-down device is separately required in order to raise a wafer and the like, the configuration becomes complex, and, accordingly, the cost is increased.

The present invention has been made, considering the above-described circumstances, and its object is to provide a device and a method for bonding tape, by which a tape member is preferably bonded to a work piece while the slack of a rubber sheet is removed, and simplified processing, reduced cost, and improved bonding strength may be realized.

SUMMARY OF THE INVENTION

In order to solve the above-described problems, the first aspect of the present invention is a tape bonding device which bonds a tape member to a work piece, including: an elastic sheet member on the upper surface of which the work piece is mounted; a vacuum chamber which is located on the side of the upper surface of the elastic sheet member, and, at the same time, is divided by the elastic sheet member; an air introducing section which is located on the side of the lower surface of the elastic sheet member, and, at the same time, is divided by the elastic sheet member; a mounting section which is located at a position where the mounting section and the air introducing section do not interfere with each other on the side of the lower surface of the elastic sheet, and on which the elastic sheet is mounted; a holding member which holds the elastic sheet member in a state in which the air is prevented from being carried into the vacuum chamber; a tape holding unit which holds the tape member in the upper portion of the work piece mounted on the elastic sheet member; a first sucking unit for vacuum suction of the inside of the vacuum chamber; a second sucking unit for vacuum suction of the air introducing section; an air introducing unit which introduces the air into the air introducing section; and a pressurizing unit which introduces the air into the inside of the vacuum chamber in a pressurized state.

According to the above configuration, the work piece is mounted on the upper surface of the elastic sheet member, and the tape member is located above the work piece by the tape holding unit. Moreover, under the above state, the first sucking unit and the second sucking unit are operated to carry out vacuum exhausting of the vacuum chamber and the air introducing section. Thereafter, the air introducing unit is operated to introduce the air into the inside of the air introducing section. Then, the elastic sheet member, which seals the boundary portion with the holding member, expands toward the inside of the chamber by the difference in pressure between the vacuum chamber under the vacuum state and the air introducing section into which the air is introduced. Then, the elastic sheet member raises the work piece by the above expansion, and the work piece makes contact with the tape member by the above raising.

When the elastic sheet member further expands from the above state, the work piece is further raised. Thereby, preferable bonding of the tape member to all over the surface of the work piece may be realized. Thus, by mounting the work piece on the upper surface of the elastic sheet member, and by expanding the elastic sheet member in the above mounted state, the tape member may be bonded to the work piece while bubbles are prevented from entering. According the above bonding, the influence of slack of the elastic sheet member may be further removed in comparison with a case in which the work piece is configured to be located under the lower surface of the elastic sheet member. Therefore, there is no need to provide a configuration in which a large tension is given to the elastic sheet member. Accordingly, the structure may be simplified. Furthermore, as the expansion of the elastic sheet member is configured to be used, a special configuration in which the work piece is moved toward the tape member is not required. Consequently, the work piece may be moved toward the tape member by use of a simple configuration.

Moreover, the pressurizing unit is operated after bonding of the tape member to introduce the air into the inside of the vacuum chamber under a pressurized state. Then, the tape member bonded to the work piece is pressed against the work piece by pressurizing. Therefore, the bonding property of the tape member to the work piece may be improved, the tape member may be prevented from easily peeling off from the work pieces.

Moreover, further another aspect of the present invention, in addition to the above-described aspect of the invention, is the tape bonding device, including a controlling unit which controls the operations of the first sucking unit, the second sucking unit, the air introducing unit, and the pressurizing unit, wherein the controlling unit performs vacuum suction of the vacuum chamber and the air introducing section by operating the first and second sucking units, introduces the air into the air introducing section by operating the air introducing unit after the vacuum suction, expands the elastic sheet member toward the inside of the vacuum chamber by the introducing of the air, raises the work piece toward the tape member for bonding the work piece to the tape member by expanding the elastic sheet member, and introduces the air into the inside of the vacuum chamber in a pressurized state by operating the pressurizing unit after bonding of the tape member to the work piece.

According to the above configuration, based on operation control by the controlling unit, operation of the first sucking unit and the second sucking unit is started in the first place for vacuum suction. Then, after the above vacuum suction, the air introducing unit is operated based on the operation control by the controlling unit. Thereby, the air is introduced into the air introducing section. Then, the elastic sheet member may be expanded toward the inside of the vacuum chamber by introducing the air. When the elastic sheet member is expanded, the work piece is raised toward the tape member. Thereby, the work piece may be bonded to the tape member. Moreover, the pressurizing unit is operated after bonding the tape member, and the bonding property of the tape member to the work piece may be improved.

Moreover, further another aspect of the present invention, in addition to the above-described aspects of the invention, is the tape bonding device, wherein the controlling unit operates the second sucking unit in the first place, and operates the first sucking unit in the second place at operation for vacuum suction of the vacuum chamber and the air introducing section.

According to the above configuration, as the second sucking unit is operated in the first place, the pressure of the air introducing section becomes lower than that of the vacuum chamber. Therefore, the elastic sheet member is pressed against the mounting section. Thus, the elastic sheet member is not expanded toward the side of the vacuum chamber at first. Consequently, the work piece and the tape member may be prevented from being bonded to each other at a stage before the air is introduced by operating the air introducing unit, and the work piece and the tape member may be bonded to each other only after vacuum suction is performed in order to prevent bubbles from being embedded in the bonding space.

Moreover, further another aspect of the present invention, in addition to the above-described aspects of the invention, is a tape bonding device, wherein the tape bonding device has a main body section, and a cover body section provided reopenable to the main body section, a sealing member, by which a space between the cover body section and the main body section is blocked airtight when the cover body section is closed to the main body section, is provided in a boundary portion between the cover body section and the main body section, the first vacuum chamber is formed between the cover body section and the elastic sheet member in the blocked state of the cover body section, and, at the same time, the vacuum chamber is formed between a space section existing in the main body section and the elastic sheet member.

According to the above configuration, the cover body section becomes reopenable to the main body section. Accordingly, setting up of the work piece and the tape member, and taking out of the work piece in a state in which the tape member is bonded to the piece may be easily performed by opening and closing the cover body section. Moreover, by the existence of the seal member, the space between the cover body section and the main body section may be made airtight by blocking Consequently, when the first sucking unit and the second sucking unit are operated, the vacuum chamber and the air introducing section may be sucked to a high degree of vacuum. Moreover, there may be generated a state in which the second vacuum chamber is originally located on the side of the lower surface of the elastic sheet member. Moreover, when the cover body section is closed to the main body, the vacuum chamber is formed between the cover body section and the elastic sheet member.

Moreover, further another aspect of the present invention, in addition to the above-described aspects of the invention, is the tape bonding device, wherein the tape holding unit is provided with an adsorbing member for adsorbing the tape member, and, at the same time, with a third sucking unit giving sucking and holding force for vacuum suction of the tape member to the adsorbing member.

According to the above configuration, vacuum suction of the tape member is performed by using the adsorbing member and the third sucking unit. Thereby, the tape member is held through the adsorbing member. Therefore, tension is not required to be applied to the tape member, and the tape member may be prevented from being extended by tension loading. Moreover, as tension is not required to be applied to the tape member, shrinkage may be prevented from generating in the tape member bonded to the work piece. Accordingly, the bonded state of the tape member may be made preferable.

Moreover, further another aspect of the present invention, in addition to the above-described aspects of the invention, is the tape bonding device, wherein the cover body section has a concave section which is depressed upward in the blocked state of the cover body section, and, at the same time, the adsorbing member being inserted into the upper bottom surface of the concave section presses downward the upward movement of the work piece and the tape member caused by expansion of the elastic sheet member.

According to the above configuration, when the elastic sheet member expands, the work piece and the tape member are raised. When the tape member reaches a predetermined height by the above raising, the tape member hits the adsorbing member, and is pressed downward. Consequently, in a state in which the tape member is pressed downward, and, at the same tome, is raised upward by the work piece, the bonding is executed. That is, as the work piece is raised upward and pressed against the tape member while the tape member is pressed downward, bonding between the work piece and the tape member may be made solid and reliable.

Moreover, further another aspect of the present invention, in addition to the above-described aspects of the invention, is the tape bonding device, wherein the material of the adsorbing member is a porous ceramics. According to the above configuration, when the third sucking unit is operated, all over the surface of the tape member may be uniformly sucked and held by the adsorbing member. Thereby, slack may be prevented from being generated in the tape member.

Moreover, further another aspect of the present invention, in addition to the above-described aspects of the invention, is the tape bonding device, wherein the tape holding unit is provided with a clamping member which clamps the end portion of the tape member, together with the adsorbing member. According to the above configuration, even when vacuum suction of the inside of the vacuum chamber is performed, and the sucking and holding force of the tape member is reduced, the above tape member may be prevented from falling because the tape member is clamped by the clamping member.

Moreover, further another aspect of the present invention, in addition to the above-described aspects of the invention, is the tape bonding device, wherein an opening-and-closing lock unit, which presses the cover body section against the main-body section, and prevents the cover body section from being opened, is provided between the cover body section and the main body section.

According to the above configuration, the cover body section is prevented from being opened by the opening-and-closing lock unit. Consequently, even when the inside of the vacuum chamber is pressurized by the pressurizing unit, the cover body section is prevented from being opening, and the inside of the vacuum chamber may be preferably pressurized.

Moreover, further another aspect of the present invention is a method for bonding a tape member to a work piece, including: a tape holding step at which a tape holding unit holds the tape member located on the side of the upper portion of the work piece; a sucking step at which, in a state in which the work piece is mounted on the upper surface of an elastic sheet member, and the tape member is located in a stretched state in the upper portion of the work piece by the tape holding unit, vacuum suction of a vacuum chamber located on the side of the upper surface of the elastic sheet member is performed by a first sucking unit, and, at the same time, vacuum suction of an air introducing section which is divided by the elastic sheet member from the vacuum chamber and which is located on the side of the lower surface of the elastic sheet member is performed by a second sucking unit; a vacuum achievement detecting step at which it is detected that the vacuum chamber and the air introducing section have reached a predetermined degree of vacuum by the sucking step; an air introducing step at which, after it has been detected at the vacuum achievement detecting step that the predetermined degree of vacuum is reached, vacuum suction of the air introducing section is stopped by stopping operation of the second sucking unit, and, at the same time, the air is introduced into the air introducing section by operating an air introducing unit; a bonding step at which, after the air introducing step, the elastic sheet member is expanded toward the inside of the vacuum chamber, the work piece is raised toward the tape member by expanding the elastic sheet member, and the work piece is bonded to the tape member; and a pressurizing step at which, after executing the bonding step for a predetermined time, the air is introduced into the inside of the vacuum chamber in a pressurized state by operating a pressurizing unit.

According to the above configuration, vacuum suction of both the vacuum chamber and the air introducing section is performed at the sucking step. After the above sucking step, it is detected at the vacuum achievement detecting step whether the predetermined degree of vacuum is reached. Then, when it is detected that the set degree of vacuum has been reached, the air is introduced into the air introducing section by operating the air introducing unit at the air introducing step. Thereby, the elastic sheet member is started to expand toward the vacuum chamber on the side of the upper surface.

Thereafter, the bonding step is started, and the work piece is raised by expansion of the elastic sheet member and is bonded to the tape member. When the above expansion is continued for a predetermined time, bonding of the tape member to all over the surface of the work piece may be realized by the continued expanding. When the pressurizing unit is operated at the pressurizing step after the above bonding, the air is introduced into the inside of the vacuum chamber under a pressurized state. Thereby, the tape member bonded to the work piece is pressed against the work piece by pressurizing.

Thus, by mounting the work piece on the upper surface of the elastic sheet member, and by expanding the elastic sheet member in the above mounted state, the tape member may be bonded to the work piece while bubbles are prevented from entering. Moreover, the influence of the slack of the above elastic sheet member may be removed in comparison with a case in which the work piece is located on the lower surface of the elastic sheet member. Therefore, as the slack of the rubber sheet is removed, there is no need to provide a configuration in which a large tension is given to the elastic sheet member. Accordingly, the bonding may be simplified. Moreover, the tape bonding device may be manufactured in an easier manner. Furthermore, as the expansion of the elastic sheet member is used, a special step at which the work piece is moved toward the tape member located upward is not required. Consequently, the work piece may be moved toward the tape member by use of a simple method. Moreover, the bonding property of the tape member to the work piece may be improved by pressurizing the vacuum chamber at the pressurizing step, and the tape member may be prevented from easily peeling off from the work piece.

Moreover, further another aspect of the present invention, in addition to the above-described aspects of the invention, is a method for bonding a tape, wherein at the sucking step, when the first and the second sucking units are operated, the second sucking unit is operated in the first place, and the first sucking unit is operated in the second place.

According to the above configuration, as the second sucking unit is operated in the first place, the pressure of the air introducing section becomes lower than that of the vacuum chamber. Accordingly, the elastic sheet member is not expanded at first toward the side of the first vacuum chamber on the side of the upper surface. Consequently, the work piece and the tape member may be prevented from being bonded at a stage before the air is introduced by operating the air introducing unit.

Effects of the Invention

According to the present invention, a tape member can be preferably bonded to a work piece while the slack of an elastic sheet member is removed. Simplified processes and reduced cost may be realized. Moreover, bonding strength between the work piece and the tape member may also be improved.

BRIEF DESCRIPTION OF THE DRAWINGS

FIG. 10 is a view showing an operation flow for a case in which a tape member is bonded to a wafer, using the tape bonding device shown in FIG. 1;

FIG. 11(a) is a view of an image showing a bonding mode for a case in which a wafer is raised and bonded to the tape member, using the tape bonding device shown in FIG. 1, and bonding is started from the center portion of the wafer to the tape member; and FIG. 11(b) is a view of an image showing a bonding mode for a case in which a wafer is raised and bonded to the tape member, using the tape bonding device shown in FIG. 1, and bonding is started from the upper end of the wafer which is inclined to the tape member.

DETAILED DESCRIPTION OF THE INVENTION

Figure 1:
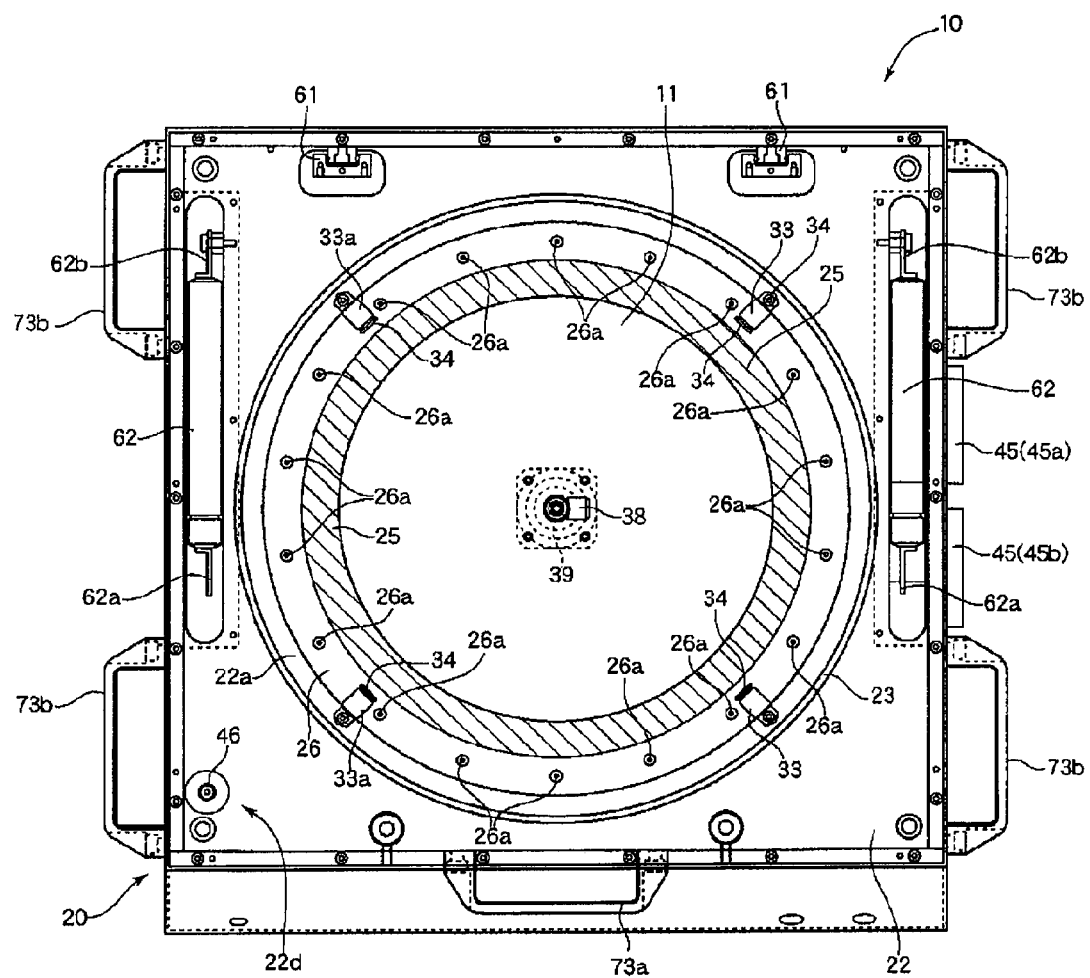
FIG. 1 is a view showing the configuration of a tape bonding device according to a first embodiment of the present invention, and a perspective plan view of a cover body section in a state in which a wafer is arranged on a rubber sheet.
Figure 2:
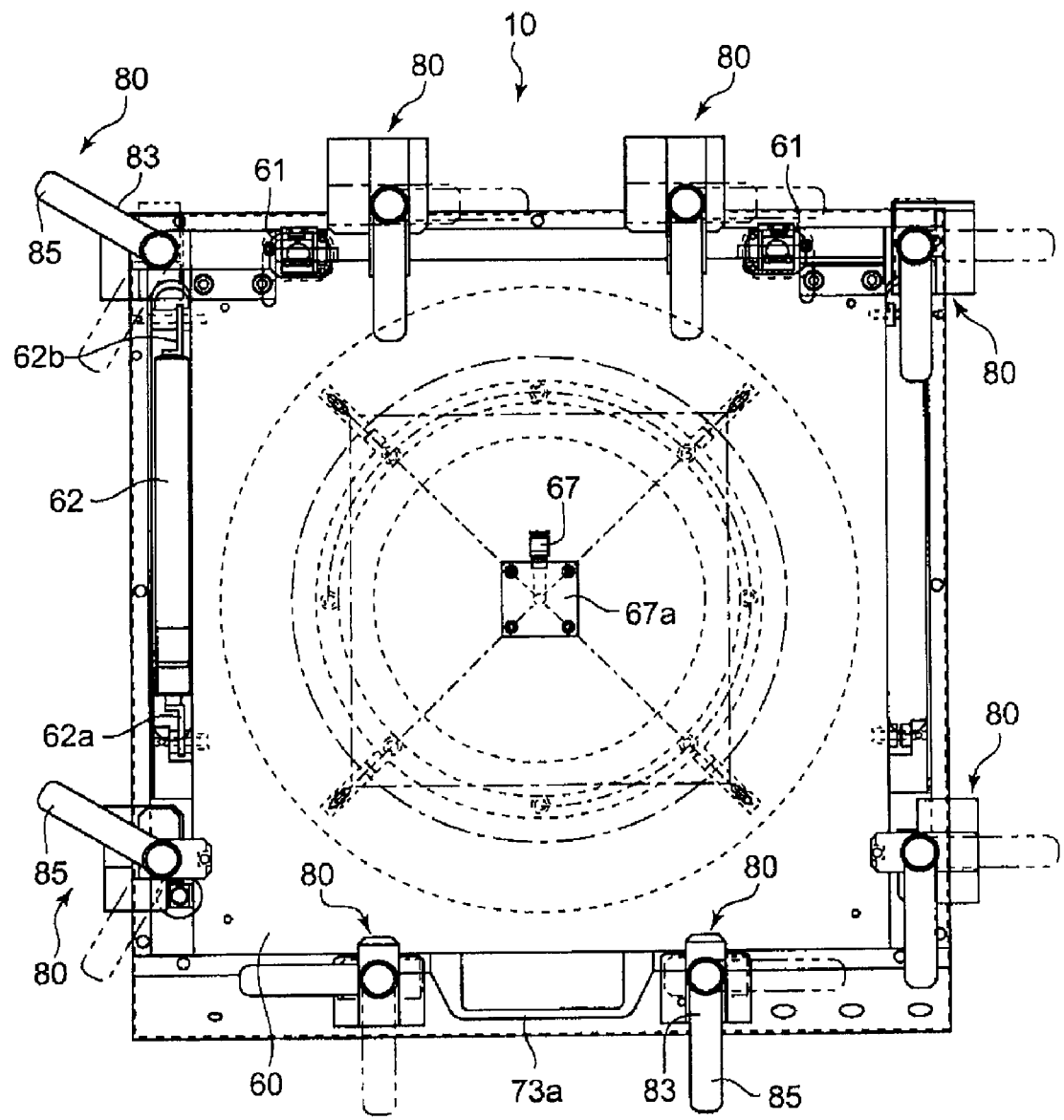
FIG. 2 is a view showing a configuration of the tape bonding device shown in FIG. 1, and is a plan view showing a state in which a cover body section is closed.
Figure 3:
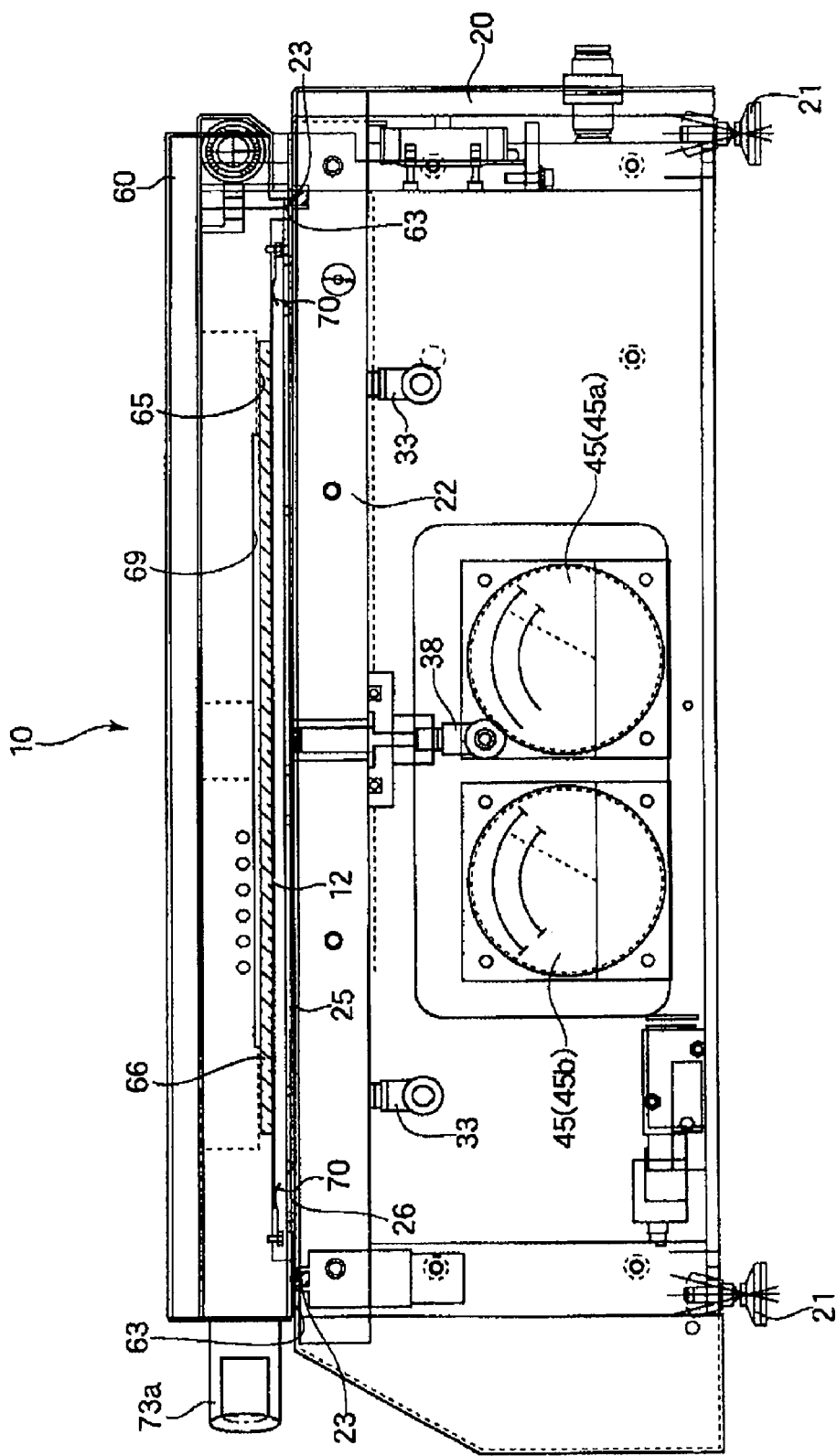
FIG. 3 is a view showing the configuration of the tape bonding device shown in FIG. 1, and a perspective side view of a part of the internal configuration under a state in which the cover body section is closed.

Hereinafter, a tape bonding device 10 according to the first embodiment of the present invention will be explained, referring to FIG. 1 through FIG. 11. FIG. 1 is a plan view of a main body section 20 seen through a cover body section 60 shown in FIG. 2, and the drawing shows a state in which a wafer 11 is mounted on a rubber sheet 25. Moreover, FIG. 2 is a plan view showing a state in which a cover body section 60 is closed in the tape bonding device 10. Moreover, FIG. 3 is a perspective side view of the internal configuration of a part of components (the rubber sheet 25 and the like) in the tape bonding device 10. Moreover, FIG. 4 is a schematic view showing a simplified configuration of an exhaust system and a control system in the tape bonding device 10 shown in FIG. 1.

As shown in FIG. 1, the plane shape of the main body section 20 is of, for example, a substantially square shape. A plurality (for example, four) of supporting legs 21 (refer to FIG. 3) are installed on the bottom surface of the main body section 20. Moreover, the tape bonding device 10 has, as shown in FIG. 3, the main body section 20, and the cover body section 60 which is pivotably provided on the main body section 20.

Figure 4:
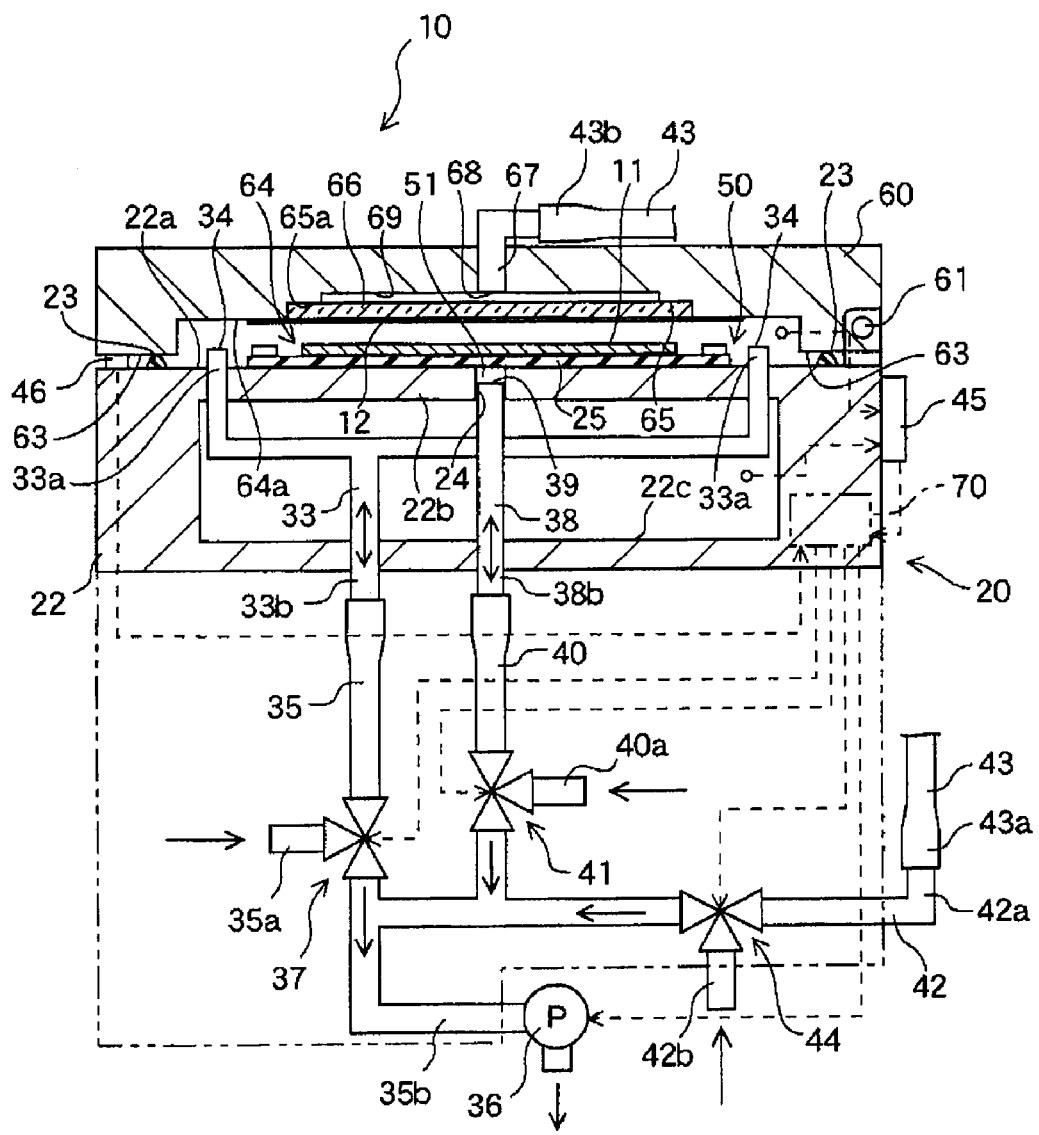
FIG. 4 is a schematic view showing a simplified configuration of an exhaust system and a control system in the tape bonding device shown in FIG. 1.

As shown in FIG. 3 and FIG. 4, a main-body top-surface section 22, which is adjacent and is opposing to the cover body section 60, is provided in the main body section 20. The main-body top-surface section 22 is configured to have appropriate strength in such a way that applied pressure (a vertical load applied, especially, from the side of the cover body section 60) at vacuum suction is received. Moreover, sidewalls and a bottom wall which support the main body section 20 and form a part thereof are configured to have enough strength in such a way that applied pressure at vacuum suction is carried.

Moreover, a seal ring 23 is installed on the outer peripheral side of the main-body top-surface section 22 as shown in FIG. 1, FIG. 3, and FIG. 4. The seal ring 23 is a member with an O-ring shape, and is applied against a ring applied section 63 on the side of the cover body section 60, which will be described later. Thereby, the inside of the tape bonding device 10 may be insulated from the outside (the air) for vacuum suction thereof.

Moreover, a mounting section 22b is provided on the side (refer to FIG. 1, and FIG. 4: hereinafter, called an inside diameter section 22a) of the central portion inner than the seal ring 23 on the main-body top-surface section 22 (refer to FIG. 4). The mounting section 22b is a portion which mounts the rubber sheet 25 that will be described later. Moreover, the mounting section 22b has an enough thickness in such a way that the section 22b is prevented from bending upward even when the upper side of the section 22b (the side of the cover body section 60) is sucked and exhausted.

A hole section 24 (refer to FIG. 4 and FIG. 6) is provided in the approximately central portion of the mounting section 22b. An air duct 38, which will be described later, engages the above hole section 24. Moreover, the air which exists in an air introducing section 51 described later is configured to be sucked through the above air duct 33, or the air is configured to be supplied to the air introducing section 51. Consequently, the hole section 24 is covered with the rubber sheet 25.

Figure 6:
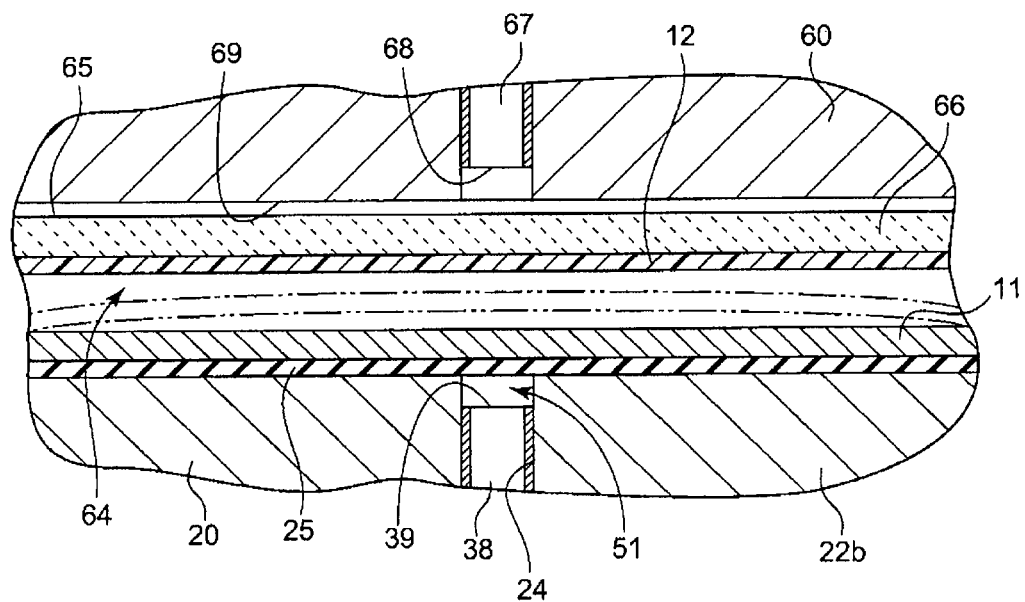
FIG. 6 is a partial cross-sectional side view showing an enlarged portion in the vicinity of an air introducing section in a structure holding the rubber sheet and the tape member in the tape bonding device shown in FIG. 1.

Furthermore, the air introducing section 51 is a portion enclosed with the rubber sheet 25 and an opening section 39 in the hole section 24 in FIG. 4, FIG. 6, and the like. However, when the rubber sheet 25 is expanded toward an upper bottom surface 64a, a region of the air introducing section 51 is expanded, and not only a portion which is enclosed with the hole section 24, the opening section 39, and the like, but also a portion which is enclosed with the upper surface of the mounting section 22b, and the rubber sheet 25 form the air introducing section 51.

Moreover, in the following explanation, the space enclosed with the seal ring 23, the ring applied section 63, the inside diameter section 22a, and the rubber sheet 25 is assumed to be a vacuum chamber 50.

Moreover, the rubber sheet 25 as an elastic sheet member is provided on the mounting section 22b in such a way that the hole section 24 is covered. The above rubber sheet 25 is a member on the upper surface of which the wafer 11 as a work piece is mounted. As described later, when the rubber sheet 25 is expanded in a state in which the wafer 11 is mounted on the rubber sheet 25, the wafer 11 rises toward the tape member 12 which will be described later.

The rubber sheet 25 is formed with a material, such as chloroprene, which may reduce generation of bubbles. However, the material of the rubber sheet 25 is not limited to the above chloroprene, and usual natural rubber, synthetic rubber, or the like may be applied. Here, the material of the rubber sheet 25 is preferably a material, such as the above-described chloroprene, which may prevent generation of bubbles.

Moreover, the diameter of the wafer 11 mounted on the upper surface of the rubber sheet 25 is 12 inches in the present embodiment. However, the size of the wafer 11 is not especially limited to the above one, and a wafer with another size, such as an 8-inch wafer, may be applied. Here, when the size of the wafer 11 is changed, the sizes of other members (the rubber sheet 25, a pressing ring 26, and the like) are required to be changed according to the changed size of the wafer 11. At any rate, the tape bonding device 10 capable of bonding a 12-inch wafer may be used, for example, for bonding the wafer 11 with a small size, such as the 8-inch wafer.

Figure 5:
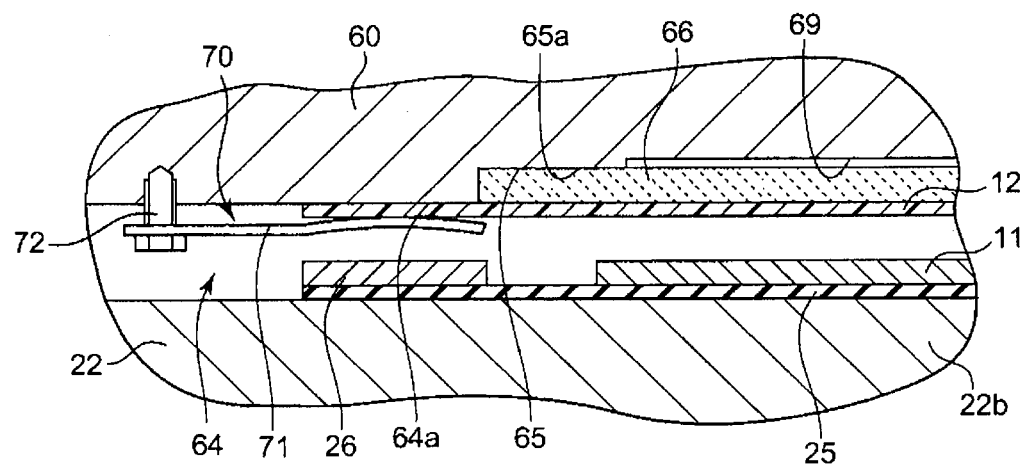
FIG. 5 is a partial cross-sectional side view showing an enlarged portion in the vicinity of a pressing ring in a structure holding a rubber sheet and a tape member in the tape bonding device shown in FIG. 1.

As shown in FIG. 1 and FIG. 5, the pressing ring 26 with an appearance of a substantially ring shape is installed on the outer peripheral edge portion in the upper portion of the rubber sheet 25 as a holding member. The pressing ring 26 is provided for pressing the rubber sheet 25. The inside diameter section 22a is pressed against the above pressing ring 26 from the upper side of the section 22a, and is fixed, for example, with screws 26a (refer to FIG. 1) along the peripheral direction at appropriate intervals. Here, the above screws 26a extend through the rubber sheet 25 when the pressing ring 26 is fixed with the screws 26a. Therefore, a hole corresponding to the through hole of the screw 26a may be formed on the rubber sheet 25 beforehand.

Moreover, the side of the end portion of the air duct 33 is arranged in the vacuum chamber 50 for vacuum suction of the vacuum chamber 50 as shown in FIG. 4. One end portion of the above air duct 33 branches to four end ones 33a (only two pieces are displayed because FIG. 4 is an cross sectional view). And, opening sections 34 of each branched air duct 33 exist in the inside of the vacuum chamber 50 as shown in FIG. 4. Moreover, the opening sections 34 are arranged at intervals of approximately 90 degrees in the plan view shown in FIG. 1 in the present embodiment. Moreover, there is the opening section 34 between the pressing ring 26 and the seal ring 23 in the inside diameter section 22a on the internal side of the seal ring 23. However, the position of the opening section 34 is not limited to the above location, but may be provided, for example, at a location overhanging the pressing ring 26.

Moreover, the air ducts 33 extend through the inside diameter section 22a, and join to one from the branched state below the main body section 20, or in the outside thereof (refer to FIG. 4). Moreover, the other end portion 33b of the air duct 33 is protruding downward from a bottom wall 22c of the main-body top-surface section 22. Furthermore, one end portion of a tube member 35 is connected to the other end portion 33b, and the other end portion 35b of the tube member 35 is connected to a vacuum pump 36. Thereby, vacuum suction of the vacuum chamber 50 may be performed when the vacuum pump 36 is operated.

Moreover, a first valve member 37 is provided in a mid-portion of the tube member 35. This first valve member 37 has a configuration in which the member 37 may be switched for communicating with the vacuum pump 36 side (hereinafter, the above switching is called switching to the suction side) for vacuum suction of the inside of the vacuum chamber 50, and, at the same time, may be switched for opening to the air introducing side (switched to the side of a protruded tube section 35a in FIG. 3: hereinafter, the above switching is called switching to the air introducing side). When the tube member 35 is opened to the air introducing side by switching the first valve member 37, the air is introduced into the inside of the vacuum chamber 50 through the above tube member 35. Moreover, for example, an electromagnetic valve which may be opened and closed with a solenoid may be used for the first valve member 37, and, moreover, a method by which opening and closing is executed by using other driving sources such as a motor may be applied.

Moreover, the vacuum pump 36 is provided outside the main body section 20 in the present embodiment. However, there may be applied a configuration in which the vacuum pump 36 is included in the inside of the main body section 20. Here, a first sucking unit includes the above vacuum pump 36, the air duct 33, the tube member 35, the first valve member 37, and the like. Moreover, a second air introducing unit includes the first valve member 37, the air duct 33, the tube member 35, the protruded tube section 35a and the like.

Moreover, the above vacuum pump 36 and the above first valve member 37 are connected to the controlling device 90 which will be described later, and operate after a signal corresponding to a control instruction from the above controlling device 90 has been received.

Moreover, as shown in FIG. 4 and FIG. 6, the air duct 38 is provided toward the back side of the rubber sheet 25 in a similar manner to that of the above-described duct 33. Different from the case of the air duct 33, the number of the above air duct 38 which is configured to thread through the above-described hole section 24 is only one. Moreover, the opening section 39 of the air duct 38 exists in the above hole section 24 (refer to FIG. 6). Furthermore, the opening section 39 is also configured to be positioned at the center of the inside diameter section 22a in the present embodiment, because the hole section 24 is located at the center of the inside diameter section 22a.

Furthermore, as in the case of the above-described air duct 33, the other end portion 38b of the air duct 38 is protruding downward from the bottom wall 22c of the main-body top-surface section 22, and, at the same time, the side of one end of the tube member 40 is connected to the other end portion 38b. Moreover, the other end portion of the tube member 40 is connected to the vacuum pump 36. Thereby, vacuum suction of the vacuum chamber 51 may be performed when the vacuum pump 36 is operated.

Moreover, a second valve member 41 is provided in a mid portion of the tube member 40. This second valve member 41 also has a configuration in which the member 41 may be switched for communicating with the vacuum pump 36 side (hereinafter, called switching to the suction side) as in the case of the above-described first valve member 37 and, at the same time, may be switched for opening to the air introducing side through a protruded tube section 40a. When the tube member 40 is opened to the air introducing side by switching the second valve member 41, the air is introduced into the air introducing section 51 through the above tube member 40. Here, the second valve member 41 is also electrically connected to the controlling device 90.

Furthermore, a second sucking unit includes the vacuum pump 36, the second valve member 41, the air duct 38, and the tube member 40. Moreover, the air introducing unit includes the second valve member 41, the air duct 38, the tube member 40, the protruded tube section 40a and the like.

Furthermore, a tube member 42, which is similar to the above-described tube members 35 and 40, is provided in the inside of the main body section 20 as shown in FIG. 4. The above tube member 42 is directed to, for example, the side of the rear end of the main body section 20 (the side of a hinge 61), and the side of one end 42a of the member 42 is protruding from the back surface of the main body section 20. Here, a pipe joint may be installed on the side of one end 42a of the tube member 42. The side of one end 43a of a flexible hose 43 is coupled to the side of one end 42a of the tube member 42. The hose 43 is extending from the main body section 20 toward the side of the cover body section 60 located at the upper position, is directed from the side of the hinge 61 to the near side (the side of the handle 73a shown in FIG. 1 and FIG. 2), and, at the same time, is provided along the side of the upper surface of the cover body section 60. Then, the other side 43b of the hose 43 is coupled to the side of one end of an air duct 67, which will be described later, approximately in the radially central portion on the upper surface of the cover body section 60

As described above, the flexible hose 43 is provided between the tube member 42 and the air duct 67 in such a way that opening and closing (pivoting) of the cover body section 60 is allowable.

Moreover, a third valve member 44 is provided in a mid-portion of the tube member 42 in a similar manner to those of the above-described first and second valve members 37 and 41. The third valve member 44 also has a configuration in which the member 44 may be switched for communicating with the vacuum pump 36 side (hereinafter, called switching to the suction side) and, at the same time, may be switched for opening to the air introducing side through a protruded tube section 42b. Furthermore, when the valve member 42 is opened to the air introducing side, the air is introduced into the side of the back surface (the side of the upper surface of the tape member 12 in FIG. 4) of the tape member 12 through the valve member 42. Thereby, the held state of the tape member 12 is released. Moreover, the third valve member 44 is also electrically connected to the controlling device 90.

Furthermore, a third sucking unit includes the vacuum pump 36, the valve member 42, the hose 43, the third valve member 44, and the air duct 67. Moreover, a tape holding unit includes an adsorbing member 66, which will be described later, the vacuum pump 36, the tube member 42, the hose 43, the third valve member 44, the air duct 67, and a clamping member 70.

Here, the present embodiment has a configuration in which sucking force caused by the vacuum pump 36 is transmitted to the side of the cover body section 60 by using the flexible hose 43, and opening and closing (pivoting) of the cover body section 60 is allowable as described above. However, a configuration by which sucking force caused by the vacuum pump 36 is transmitted to the side of the cover body section 60 is not limited to the use of the hose 43. In some cases, there is preferred a configuration, for example, in which a member for vacuum suction, such as the hose 43, does not protrude from the tape bonding device 10 to the outside.

In the above case, an opening on the side of the cover is formed, for example, in the ring applied section 63 of the cover body section 60, and, at the same time, an opening on the side of the main body is formed at a position opposing to the opening on the side of the cover in the main-body top-surface section 22. Along with the above configuration, a ring-like rubber seal is installed on the surrounding of at least one of the opening on the side of the cover or that on the side of the main body in such a way that the seal is protruding therefrom. Moreover, the side of one end of the tube member is configured to be coupled to the opening on the side of the cover, and the other side of the above tube member is configured to communicate with a concave section 64. Furthermore, an air duct is provided in the opening on the side of the main body similarly as described above. According to the above configuration, when the cover body section 60 is closed, the tube member and the air duct are connected to each other. Moreover, the rubber seal is provided between the ring applied section 63 and the main-body top-surface section 22, and both of the opening on the side of the cover and that on the side of the main body are blocked airtight.

Moreover, there may be applied a configuration in which a bendable, retractable bellows-like pipe joint is provided at a location, at which the hinge 61 exists, in a portion where the main body section 20 and the cover body section 60 are opposing to each other, and the tube member provided in the inside of the main body section 20 and the air ducts which travel in the inside of the cover body section 60 are coupled through the above pipe joint.

Moreover, only one vacuum pump 36 is provided in the present embodiment. Moreover, vacuum suction of at least one of the vacuum chamber 50, the air introducing section 51, and the side of the back surface (the side of the upper surface) of the tape member 12 and/or bringing at least one of the vacuum chamber 50, the air introducing section 51, and the side of the back surface of the tape member 12 into an atmospheric pressure state may be realized by switching the first through third valve members 37, 41, and 47 to the air introducing side, and to the suction side.

However, the number of the vacuum pump 36 is not limited to one, but there may be applied a configuration in which two, or three or more pumps are provided, corresponding to each of the first sucking unit, the second sucking unit, and the third sucking unit. Moreover, there may be another configuration in which both of a valve member to the suction side and a valve member to the air introducing side are provided in each of the tube members 35, 40, and 42 without using a three way valve such as the first valve member 37, the second valve member 41, and the third valve member 41. Even with the above configurations, suction/non-suction of the vacuum chamber 50, the air introducing section 51, and the side of the back surface (the side of the upper surface) of the tape member 12 may be preferably switched.

Furthermore, a vacuum gage 45 is installed on the outer surface of the side wall of the main body section 20 as shown in FIG. 3. The number of the provided vacuum gages 45 is two in the present embodiment. However, it is preferable that three vacuum gages are provided, corresponding to the number of the tube members 35, 40, and 42, in the present embodiment. One of the above vacuum gages 45 measures atmospheric pressures of the inside of the vacuum chamber 50 (hereinafter, called a vacuum gage 45a as required). Moreover, the other one of the vacuum gages 45 measures atmospheric pressures of the air introducing section 51 (hereinafter, called a vacuum gage 45b as required). Furthermore, both of the above two vacuum gages 45a and 45b are connected to the controlling device 90.

Moreover, a sensor 46 is provided at one corner portion 22d (Refer to FIG. 1) among two corner portions on the main-body top-surface section 22, wherein the two corner portions are most remote from, for example, hinges 61, which will be described later. The sensor 46 uses, for example, a magnetic sensor, and detects whether the cover body section 60 is closed in such a way that the section 60 approaches the main body section 20 within a predetermined distance. Moreover, the above sensor 46 is also connected to the controlling device 90, and transmits a detection signal, which detects whether the cover body section 60 is closed, to the controlling device 90. Then, the controlling device 90 transmits a signal corresponding to an operation to the vacuum pump 36 and the like only when the detection signal corresponding to a state, in which the cover body section 60 is closed, is received.

Subsequently, the configuration of the cover body section 60 will be explained. As shown in FIG. 1, FIG. 2, and FIG. 5, the cover body section 60 is connected to the main body section 20 through the hinge 61. That is, the cover body section 60 may be pivoted about the hinges 61. Moreover, as shown in FIG. 1, one end 62a of each of two damper members 62 is installed to the cover body section 60. Moreover, the other end 62b of each of the damper members 62 is installed to the main-body top-surface section 22. This damper member 62 is configured to be retractable, and, at the same time, the viscous resistance of a viscous body (oil and the like) existing in the member 62 prevents the cover body section 60 from being rapidly lowered to the main body section 20.

Figure 7A:
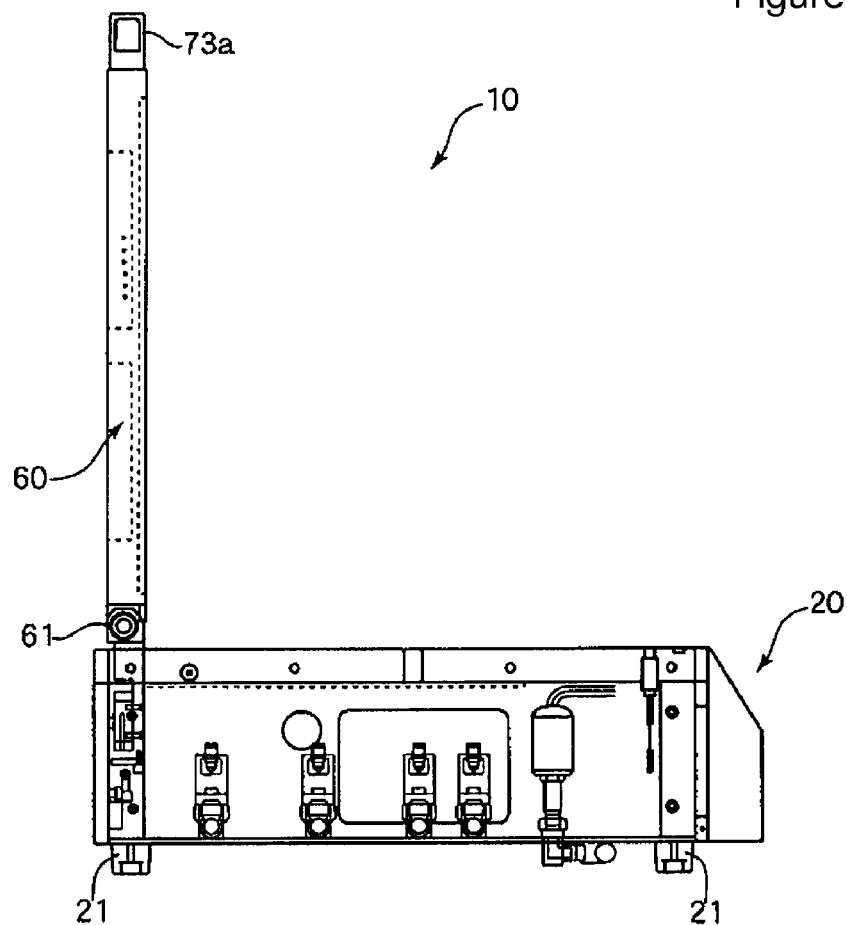
FIG. 7(a) is a view showing the configuration of the tape bonding device shown in FIG. 1, and a perspective side view of a part of internal configuration in a state in which the cover body section is opened.
Figure 7B:
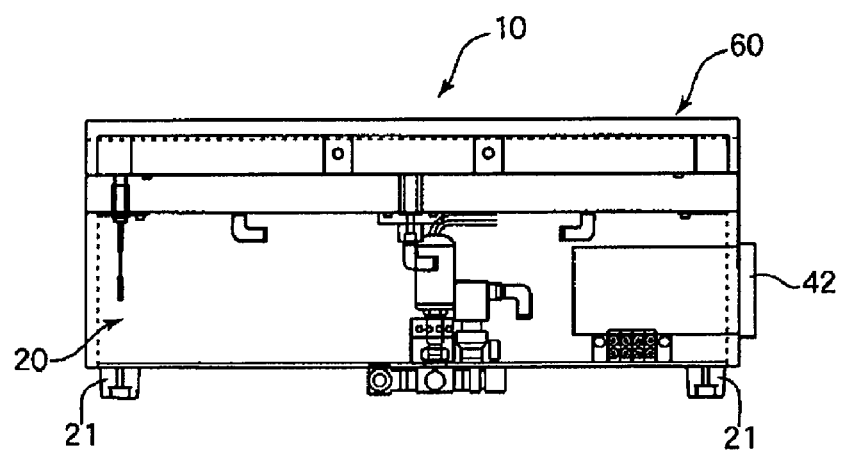
FIG. 7(b) is a view showing the configuration of the tape bonding device shown in FIG. 1, and a principal and sectional view of a state in which the cover body section is closed, seen from the side of the front surface.

Moreover, the damper member 62 includes a spring member (not shown), and may maintain a state (for example, a state shown in FIG. 7(a)) in which the cover body section 60 is opened. However, when the state in which the cover body section 60 is opened is not required to be maintained, the spring member may be configured to be eliminated.

Moreover, a portion of the cover body section 60 which applies against the seal ring 23 of the main body section 20 is a ring applied section 63, as shown in FIG. 3 and FIG. 4. The ring applied section 63 seals the vacuum chamber 50 by applying against the seal ring 23. Furthermore, in order to realize preferable sealing, the ring applied section 63 includes a plate-like portion forming one plane in the present embodiment.

As shown in FIG. 3 to FIG. 5 a concave section 64 is formed on the cover body section 60 at a location which is on an opposing surface opposing to the main body section 20 and inner than the inside diameter side of the ring applied section 63. The above concave section 64 is formed in a hollow state in which the section 64 is lowered from the ring applied section 63. The above concave section 64 has a size corresponding to the above-described inside diameter section 22a. Consequently, when the cover body section 60 is closed and the seal ring 23 is applied against the ring applied section 63 to form a sealed state, there is generated a space enclosed with the above concave section 64, the seal ring 23, the inside diameter section 22a, and the rubber sheet 25. And, the above space becomes the vacuum chamber 50.

Moreover, the bottom surface (hereinafter, called upper bottom surface 64a) located in the upper portion of the concave section 64 becomes a portion which prevents the peripheral edge portion of the tape member 12 from moving upward (receives the tape member 12 moving upward) when the rubber sheet 25 is expanded. Consequently, the depth of the concave section 64 is set in such a way that the peripheral edge portion of the tape member 12 may be received and may be preferably bonded to the wafer 11.

An engaging concave section 65 is provided in the concave section 64. The engaging concave section 65 is a portion which is depressed toward the side of the upper surface from the concave section 64, and has a diameter smaller than that of the concave section 64. For example, the adsorbing member 66 made of a porous material such as a porous ceramics is inserted into the above engaging concave section 65. The tape member 12 is sucked and held through the above absorbing member 66. Furthermore, the adsorbing member 66 has a dimension slightly smaller than that of the above engaging concave section 65, wherein the dimension conforms to the above insertion to the engaging concave section 65.

Moreover, the air duct 67 is provided in the cover body section 60 as shown in FIG. 4 and FIG. 6. There is provided the air duct 67 having an approximately L-shaped cross section. Thereby, the side of one end of the air duct 67 is provided along the upper surface of the cover body section 60, and, at the same time, the side of the other end of the air duct 67 penetrates through the cover body section 60 to reach the engaging concave section 65. Here, a potion, which is opened to the engaging concave section 65, in the side of the other end of the air duct 67 is assumed to be an opening section 68. Moreover, the present embodiment has a configuration in which a fixed member 67a is provided on the upper surface of the cover body section 60, and the air duct 67 is installed on the upper surface of the cover body section 60 through the fixed member 67a.

Here, it is preferable that a depressed section 69 which is slightly depressed from the upper bottom surface 65a of the above engaging concave section 65 is provided on the engaging concave section 65. In this case, the depressed section 69 is configured to have a shape with a diameter smaller than that of the engaging concave section 65, and the upper bottom surface 65a of the engaging concave section 65 excluding the depressed section 69 is configured to receive the outer peripheral portion of the adsorbing member 66. When the above depressed section 69 exists, a negative pressure caused between the depressed section 69 and the adsorbing member 66 is applied in a larger area. Therefore, the adsorbing member 66 may adsorb the wafer 11 in the larger area.

Figure 8:
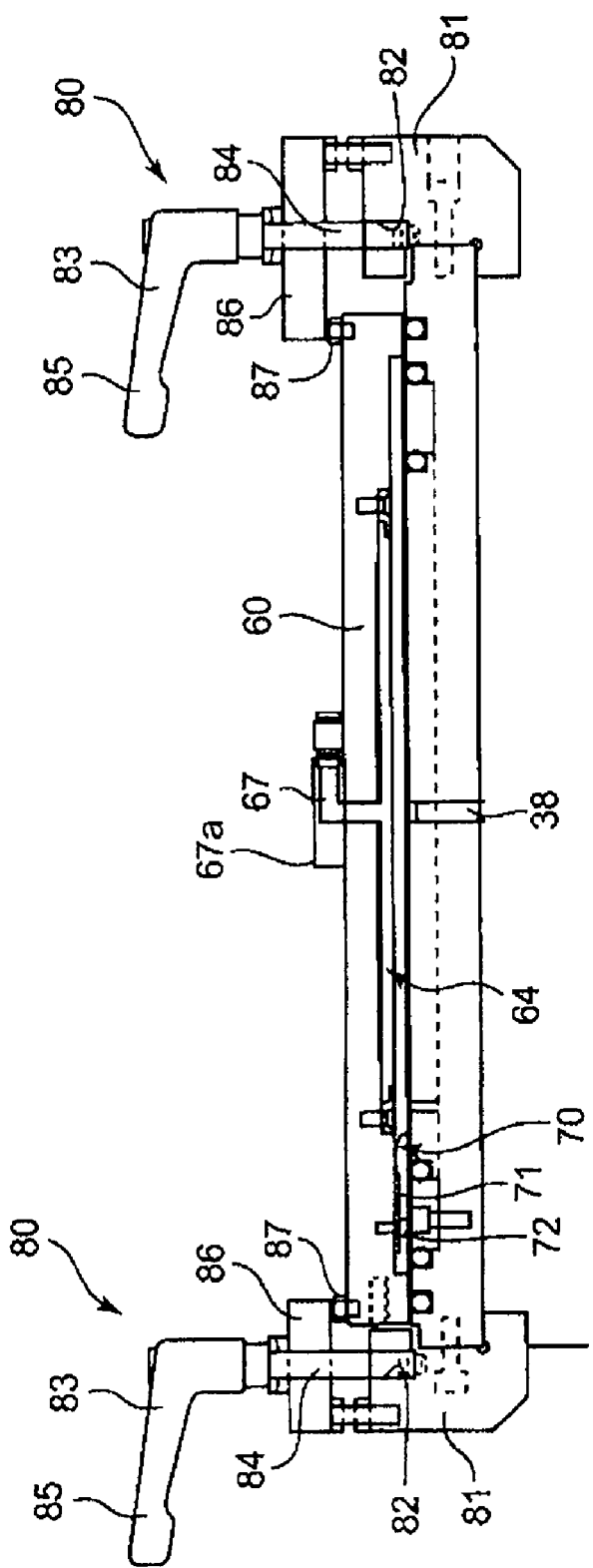
FIG. 8 is a side view perspectively showing the internal configuration of the cover body section, and, at the same time, showing an installed state of a locking mechanism existing between the cover body section and a main body section in the tape bonding device shown in FIG. 1.

Moreover, the clamping member 70 which fixes a corner portion of the tape member 12 is provided in the outside of the engaging concave section 65 and in the inside of the concave section 64 as shown in FIG. 3, FIG. 5, and FIG. 8. As shown in FIG. 5, the clamping member 70 is provided with a leaf spring 71, and the side of one end of the above leaf spring 71 is installed in the concave section 64 with a screw 72. Moreover, the side of the other end of the leaf spring 71 is pressed against the upper bottom surface 64a by energizing force. However, the side of the other end of the leaf spring 71 is made openable against the energizing force of the leaf spring 71. Moreover, four clamping members 70 are provided at intervals of approximately 90 degrees in the peripheral direction of the concave section 64 in the present embodiment.

Moreover, a handle 73a is installed at a portion opposing to the hinge 61 on the sidewall portion of the cover body section 60. Therefore, an operator may easily open and close the cover body section 60 by holding the handle 73a. Moreover, a total of four handles 73b are provided on the sidewall portions of the main body section 20 in such a way that the four handles form two pairs of handles, and two handles as one pair are opposing to each other. The tape bonding device 10 may be easily moved by holding the handle 73b.

Figure 9:
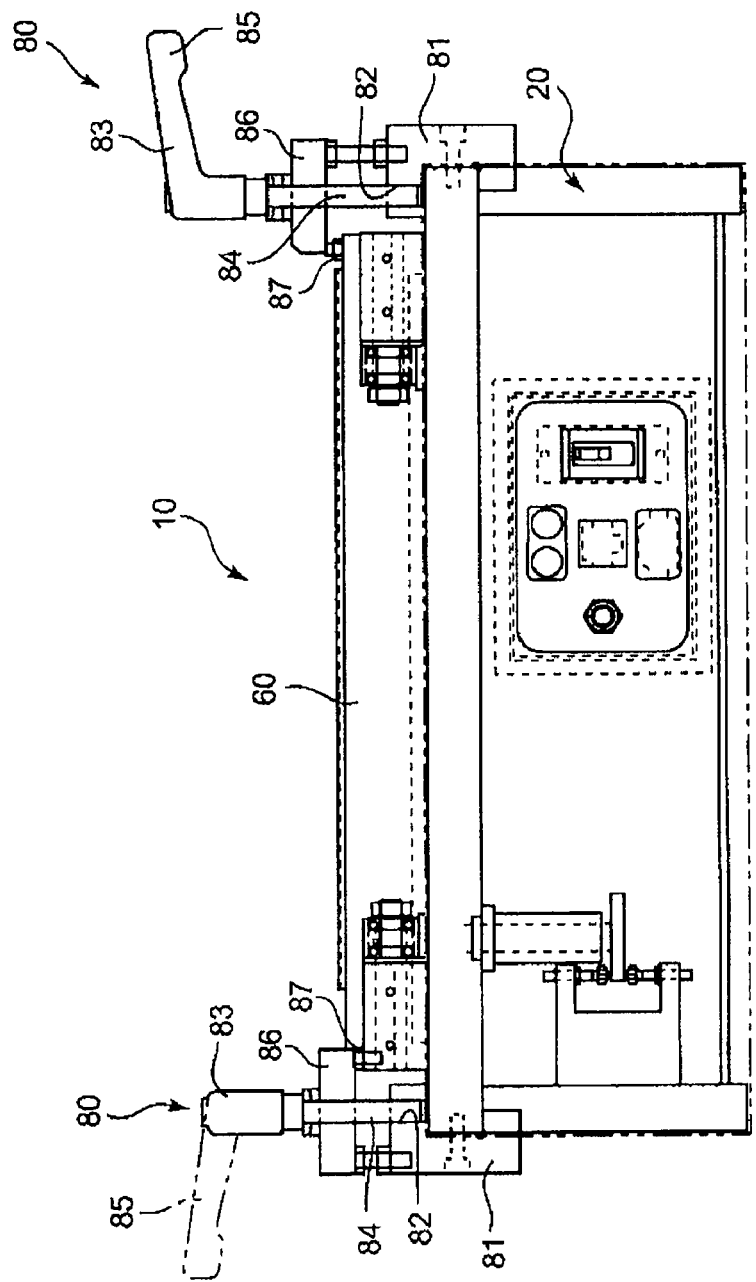
FIG. 9 is a rear view showing the configuration of the tape bonding device shown in FIG. 1.

Moreover, a locking mechanism 80 as an opening-and-closing lock unit is provided in the tape bonding device 10 as shown in FIG. 2, FIG. 8, and FIG. 9. The locking mechanism 80 is provided with a block section 81 installed in the side of the main body section 20. A screw hole 82 is provided in the above block section 81, and a screw section 84 of a lever member 83 is screwed into the above screw hole 82. Moreover, the lever member 83 is provided with the screw section 84, and a holding section 85 which protrudes toward the direction deviating from the axis of the above screw section 84.

Among these, a screw thread which is screwed together with the screw hole 82 is formed in the screw section 84. A clamp member 86 is threaded through the above screw 84. Moreover, the holding section 85 is a portion which the operator holds, and the lever member 83 may be rotated by the above holding.

The clamp member 86 that threads through the screw section 84 is a rectangular parallelepiped member, and is rotatably provided around the screw section 84. The longitudinal direction of the above clamp member 86 may be arranged to be perpendicular to the side edge direction of the cover body section 60, and, according to the above configuration, the clamp member 86 overhangs the upper portion of the cover body section 60 to prevent opening of the cover body section 60. Moreover, the longitudinal direction of the clamp member 86 may be arranged to be parallel to the side edge direction of the cover body section 60, and, according to the above configuration, the clamp member 86 does not overhang the upper portion of the cover body section 60 to allow opening of the cover body section 60.

Furthermore, the present embodiment has a configuration in which a bolt 87 is installed at a location opposing to the clamp member 86 on the cover body section 60, and the member 86 applies against the above bolt 87.

Moreover, the controlling device 90 as a controlling unit is provided in the tape bonding device 10 as shown in FIG. 4. As described above, the controlling device 90 is electrically connected to the vacuum pump 36, the first to third valve members 37, 41, and 44, the vacuum gage 45, and the sensor 46. Control buttons for ON operation (not shown) are coupled to the above controlling device 90. Consequently, when the operator pushes a control button under a state in which the sensor 46 permits ON operation by closing the cover body section 60, the vacuum pump 36 operates.

Here, the controlling device 90 gives control signals to each of the first to third valve members 37, 41, and 44 in such a way that vacuum suction of the rubber sheet 25 and the wafer 11 is performed only for predetermined time, while maintaining a state in which the second and third valve members 41 and 44 are switched to the suction side in the first place and, at the same time, the first valve member 37 is switched to the air introducing side. Then, the control signal is given to the first valve member 37 after a lapse of the predetermined time, and the member 37 is switched from the air introducing side to the suction side to perform vacuum suction of the vacuum chamber 50.

Moreover, when the sensor 46 detects by measurement that the vacuum chamber 50 and the air introducing section 51 reach a predetermined degree of vacuum, the controlling device 90 gives a control instruction, by which the second valve member 41 is switched to the air introducing side, to the member 41. Thereby, the rubber sheet 25 is expanded to start bonding between the wafer 11 and the tape member 12. Moreover, after the predetermined time has passed from the above state to complete the bonding, the controlling device 90 gives a control instruction for switching the first valve member 37 to the air introducing side. Both the vacuum chamber 50 and the air introducing section 51 reach a state, in which the pressure is equal to the atmospheric pressure, by the above switching to complete the bonding operation.

Furthermore, according to instructions of the controlling device 90, the vacuum pump 36 is rotated backward, and the first valve member 37 or the third valve member 44 is switched to the same side as the suction side. Thereby, the air is introduced into the inside of the vacuum chamber 50 in a pressurized state. Furthermore, without adopting the configuration by which the vacuum pump 36 is rotated backward, there may be applied a configuration in which the pressurized state of the inside of the vacuum chamber 50 is realized, for example, by switching the connection between a tube member connected to the discharging side of the vacuum pump 36 and a tube member which is separately connected to the flowing-in side of the vacuum pump 36 and may introduce the air.

Here, one example of the above-described degree of vacuum is about 20 Pa. However, the predetermined degree of vacuum is not limited to the above value. Any degree of vacuum which is lower than the atmospheric pressure may be applied. Moreover, the controlling device 90 may have a configuration in which a control instruction is given to the vacuum pump 36 after completing bonding in such a way that the first valve member 37 is switched to the air introducing side, and the vacuum pump 36 is stopped. However, in this case, sucking time for the subsequent vacuum suction becomes somewhat longer in comparison with a case in which operation of the vacuum pump 36 is continued.

Action (operation) of the tape bonding device 10 with the above-described configuration will be explained hereinafter. Moreover, the action (operation) will be executed based on an operation flow shown in FIG. 10.

In the first place, the operator opens the cover body section 60, mounts the wafer 11 on the rubber sheet 25, and, at the same time, installs the tape member 12 on the clamping member 70 (step S10). In this case, there is generated a state in which the tape member 12 is clamped between the leaf spring 71 and the upper bottom surface 64a. Thereby, there is caused a state in which the back surface of the tape member 12 is applied against the adsorbing member 66, and, at the same time, the adhesive surface of the tape member 12 (front surface) is turned downward.

Here, there may be a configuration in which, when the tape member 12 is installed using the clamping member 70, the vacuum pump 36 is operated. When the vacuum pump 36 is operated in an opened state of the cover body section 60, sucking and holding force is transmitted to the adsorbing member 66 through the tube member 42 and the air duct 67. Thereby, there is generated a state in which the tape member 12 is sucked and held by the adsorbing member. And, sucking and holding of the above tape member 12 causes a state in which there are no wrinkles on the tape member 12 in an opened state of the cover body section 60.

Subsequently, the cover body section 60 is lowered toward the main body section 20 until the sensor 46 detects that the cover body section 60 is closed (step S11). Then, the controlling device 90 judges whether the sensor 46 detects that the cover body section 60 is blocked by the above lowering (step S12). Then, when the sensor 46 detects the blocked state, the controlling device 90 permits operation of the vacuum pump 36. When the operator pushes the control button in the above state, operating of the vacuum pump 36 is started.

Moreover, after the cover body section 60 is closed, the operator rotates the clamp member 86 to cause a state in which the tip portion of the above clamp member 86 overhangs the upper surface of the cover body section 60. Thereafter, the operator holds the lever member 83, and rotates the lever member 83 in the closing direction, and the lower surface of the clamp member 86 is applied against the bolt 87. When the lever member 83 is further rotated in the closing direction in the above applied state, the cover body section 60 is pushed by the clamp member 86, and the ring applied section 63 is pressed against the seal ring 23. Furthermore, when the lever member 83 is rotated, it is preferable that all the lever members 83 are sequentially rotated little by little to prevent generation of deviation in the locked state.

Then, the lever member 83 is rotated for closing by a predetermined amount, the seal ring 23 is pressed by the ring applied section 63 to elastically be deformed, and the inside of the vacuum chamber 50 is blocked airtight from the outside (step S13). Accordingly, when opening of the cover body section 60 is locked by the locking mechanism 80, the cover body section 60 is not raised for opening even when the inside of the vacuum chamber 50 is pressurized, and the vacuum chamber 50 may be sealed from the outside.

When the operator pushes the control button, the controlling device 90 detects the above pushing, and gives an instruction for operation to the vacuum pump 36. Thereby, the vacuum pump 36 is operated and vacuum suction of the vacuum chamber 50, the tape member 12, and the rubber sheet 25 is performed (corresponding to the sucking step). Moreover, when sucking and holding of the tape member 12 is performed under a state in which the cover body section 60 is opened, the opening and holding state is continued. Moreover, when the above-described vacuum pump 36 is operated, the vacuum suction of the tape member 12 and the rubber sheet 25 is performed before anything else by switching the second valve member 41 and the third valve member 44 to the suction side at first, and, at the same time, by switching the first valve member 37 to the air introducing side (step S14).

Then, after the above vacuum suction of the tape member 12 and the rubber sheet 25 is performed for a predetermined time, the first valve member 37 is switched from the air introducing side to the suction side to execute vacuum suction of the vacuum chamber 50, together with the tape member 12 and the rubber sheet 25 (step S15).

When the vacuum pump 36 performs vacuum suction for the predetermined time, the vacuum gage 45 detects that the vacuum chamber 50 and the side of the back surface of the rubber sheet 25 have reached the predetermined degree of vacuum (step S16: corresponding to a vacuum achievement detecting step). When the above vacuum gage 45 detects the predetermined degree of vacuum, the gage 45 transmits a predetermined detecting signal to the controlling device 90. Then, the controlling device 90 switches the second valve member 41 to the air introducing side while the vacuum pump 36 kept being operated (step S17: corresponding to a first air introducing step). Thereby, the air is introduced into the air introducing section 51 through the protruded tube section 40a.

When the air is introduced into the air introducing section 51, the rubber sheet 25 expands toward the side of the vacuum chamber 50 according to difference in pressure between the side of the vacuum chamber 50 and that of the air introducing section 51. In this case, the wafer 11 is raised by expanding the rubber sheet 25, and the upper surface of the wafer 11 makes contact with tape member 12. Then, bonding of the tape member 12 to the upper surface of the wafer 11 is started (step S18: corresponding to the bonding step).

Here, there are two modes for bonding between the upper surface of the wafer 11 and the tape members 12 as shown in FIG. 11(a) and FIG. 11(b). In the first place, a first mode is a case in which the wafer 11 is bonded to the tape member 12 from an approximately central portion on the upper surface of the above wafer 11 under a state, in which the wafer 11 is in parallel with the tape member 12 with no inclination relative thereto as shown in FIG. 11(a).

In this case, when the wafer 11 is raised by expansion of the rubber sheet 25, contact with the tape member 12 on which slack is removed by holding the member 12 with the adsorbing member 66 is performed from the central portion of the wafer 11. When the rubber sheet 25 is further expanded from the above contacted state, the central portion of the rubber sheet 25 is unable to move further from the above state because the central portion of wafer 11 makes contact with the tape member 12, but the peripheral side of the rubber sheet 25 is moved upward by further expansion to sequentially cause contact of the wafer 11 with the tape member 12.

Consequently, as the rubber sheet 25 is expanded, bending of the peripheral portion of the sheet 25 is eliminated, and bonding of the wafer 11 to the tape member 12 sequentially progresses from the center side toward the peripheral side. Furthermore, when a predetermined time has passed, maintaining the above state, bonding between the wafer 11 and the tape member 12 is surely executed.

According to the above-described bonding mode, bonding between the upper surface of the wafer 11 and the tape member 12 is executed while air is removed outward from the central portion of the wafer 11 (tape member 12). Here, the vacuum pump 36 continues vacuum suction of the vacuum chamber 50 in this bonding mode. Consequently, bonding between the wafer 11 and the tape member 12 is preferably executed by removing air existing between the upper surface of the wafer 11 and the tape member 12 along with the above-described bonding mode.

Moreover, a second bonding mode is a case in which the wafer 11 is bonded to the tape member 12 from the highest portion (hereinafter, called an upper end) on the above inclined wafer 11 in a state in which the wafer 11 is inclined with respect to the tape member 12 as shown in FIG. 11(b). In this case, bonding of the wafer 11 to the tape member 12 is started from the upper end on the inclined wafer 11 in the first place. In other words, bonding to the tape member 12 on which slack is removed by holding the member 12 with the adsorbing member 66 is performed from the upper end of the wafer 11 when the wafer 11 is raised as the rubber sheet 25 is expanded.

Here, as the tape member 12 is held by the adsorbing member 66, the tape member 12 does not move upward even when the tape member 12 is pressed by the wafer 11. Therefore, when the rubber sheet 25 is gradually expanded, the above wafer 11 is raised under a state in which the wafer 11 is pivoted about a contacted portion (upper end portion) of the wafer 11 between the wafer 11 and the tape member 12 to gradually reduce the angle of inclination of the wafer 11. Then, the raising of the above wafer 11 is continued until the angle of inclination of the wafer 11 becomes 0. Here, when a predetermined time has passed after the angle of inclination of the wafer 11 becomes 0, bonding between the wafer 11 and the tape member 12 is surely executed.

According to the above-described bonding mode, bonding between the upper surface of the wafer 11 and the tape member 12 is executed while air is removed from the upper end of the wafer 11 (tape member 12) toward the end portion on the other side. Here, the vacuum pump 36 continues vacuum suction of the vacuum chamber 50 even in this bonding mode. Consequently, bonding between the wafer 11 and the tape member 12 is preferably executed by removing air existing between the upper surface of the wafer 11 and the tape member 12 along with the above-described bonding mode.

As described above, the controlling device 90 continues switching of the second valve member 41 to the air introducing side for a predetermined time while continuing switching of the first valve member 37 to the suction side (step S19). Thereby, bonding between the wafer 11 and the tape member 12 is executed.

Here, the vacuum chamber 50 and the side of the back surface of the tape member 12 finally have the same pressure when the tape member 12 is bonded to the wafer 11, because vacuum and exhausting are simultaneously executed through the air duct 38 and the air duct 67. Consequently, when the vacuum sucking proceeds, there is generated a state in which the tape member 12 is easily separated from the adsorbing member 66.

When the controlling device 90 judges at the step S19 that the predetermined time has passed, the controlling device 90 rotates the vacuum pump 36 backward, and, at the same time, switches the third valve member 44 to the same side (pressurizing side) as that of vacuum suction. Simultaneously, the first valve member 37 and the second valve member 41 are configured to be closed.

Thereby, the tape member 12 is separated from the adsorbing member 66, and, at the same time, the air is introduced into the vacuum chamber 50 through the air duct 67 in a pressurized state. In this case, vacuum suction of the vacuum chamber 50 is released in the first place, and expansion of the rubber sheet 25 is released to cause a state in which the rubber sheet 25 is mounted on the mounting section 22b. Subsequently, the vacuum chamber 50 is put into a pressurized state with a pressure higher than the atmospheric pressure, and the tape member 12 is pressed against the wafer 11 for pressurizing (step S20: corresponding to the pressurizing step). The above pressurizing improves an adhesive property between the tape member 12 and the wafer 11.

Here, the pressure given to the tape member 12 and the like by pressurizing is about 4 through 5 kg/cm$^2$ in the present embodiment. Moreover, not only the third valve member 44, but also the first valve member 37 may be switched to the same side (pressurizing side) as that of vacuum suction. In this case, the air is introduced into the vacuum chamber 50 in a pressurized state not only through the air duct 67, but also through the air duct 33.

Moreover, when the same number of vacuum pumps 36 as that of the first through third valve members 37, 41, and 44 are provided, the inside of the vacuum chamber 50 is pressurized by rotating backward at least one of the vacuum pumps 36 to which the first valve member 37 and the third valve member 41 are connected. Moreover, the second valve member 41 is switched to the air introducing side, and, at the same time, the vacuum pump 36 is stopped, or the second valve member 41 is switched to the vacuum suction side. At the same time, the vacuum pump 36 is rotated in the normal direction to perform vacuum suction of the air introducing section 51. According to the above configuration, adhesion of the tape material 12 to the wafer 11 may be preferably executed.

When the controlling device 90 judges that the pressurized state of the vacuum chamber 50 has continued for the predetermined time, the controlling device 90 stops operation of the vacuum pump 36 to switch the first through third valve members 37, 41, and 44 to the air introducing side (step S21). Thereby, the pressures of the back surface of the tape member 12, the vacuum chamber 50 and the air introducing section 51 becomes the atmospheric pressure, and the above-described pressurized state is released.

Moreover, when the first to third valve members 37, 41, 44 are switched to the air introducing side at the step S21, a state in which the operation of the vacuum pump 36 is continued is maintained. Thereby, quick response to the subsequent bonding operation for the wafer 11 may be realized. However, the above operation may be configured to be stopped.

Thereafter, the operator rotates the lever member 83 in the opening direction to open the cover body section 60. Then, the operator releases holding of the tape member 12 by the clamping member 70, and the wafer 11 in a state that the tape member 12 is bonded to the wafer 11 is taken out (step S22). Bonding of the tape member 12 to the upper surface of the wafer 11 is completed on the way described above.

Moreover, after the bonding of the tape member 12 to the upper surface of the wafer 11 has been completed, the process proceeds to the subsequent steps, for example, dicing processing.

According to the tape bonding device 10 with the above-described configuration, bonding of the tape member 12 to the upper surface of the wafer 11 may be realized, using expansion of the rubber sheet 25. Consequently, bonding of the tape member 12 to the upper surface of the wafer 11 may be surely realized, using the difference in pressure between the atmospheric pressure and the vacuum state though the device 10 has a simple configuration. Especially, the attitude of the wafer 11 may be easily corrected by elastic deformation of the rubber sheet 25 even when the wafer 11 is in so-called partial contact with the tape member 12 by use of the rubber sheet 25. Consequently, there may be obtained preferable bonding of the tape member 12 to the upper surface of the wafer 11.

Moreover, when the above-described tape bonding device 10 is used, the inside of the vacuum chamber 50 may be pressurized. Consequently, the adhesive property between the wafer 11 and the tape member 12 may be further improved, and bonding between the wafer 11 and the tape member 12 may be further surely performed. Consequently, the tape member 12 may be prevented from easily peeling off from the wafer 11.

Moreover, the wafer 11 is mounted on the upper surface of the rubber sheet 25. Consequently, the influence of the slack of the above rubber sheet 25 may be removed. Therefore, as the influence of the slack is removed, there is no need to provide a configuration in which a large tension is given to the rubber sheet 25. Accordingly, the structure of the tape bonding device 10 may be simplified. Moreover, as the required tension given to the rubber sheet 25 may be reduced, man-hours of workers who manufacture the tape bonding device 10 may be reduced. Furthermore, when the rubber sheet 25 is pressed with the pressing ring 26, the airtightness may be improved.

Furthermore, as the expansion of the rubber sheet 25 is used, special configuration in which the wafer 11 is moved toward the tape member 12 located upward is not required. Consequently, the wafer 11 may be moved toward (upward) the tape member 12 by use of a simple configuration.

Moreover, the tape member 12 is sucked and held by the adsorbing member 66. Therefore, a member for stretching the tape member 12 such as a tape frame and a unit which supports the member for stretching are not required to separately be provided. Accordingly, the configuration existing in the inside of the concave section 64 may be simplified. Moreover, as the tape member 12 is sucked and held by the adsorbing member 66, tension is not required to be applied to the tape member 12, and the tape member 12 may be prevented from being extended by tension loading. Moreover, as the above tape member 12 is not stretched when the tape member 12 is held, tension is not required to be applied to the tape member 12. Consequently, shrinkage caused by tension may be prevented from generating in the tape member 12 bonded to the wafer 11, and the bonded state of the tape member 12 may be made preferable.

Moreover, the adsorbing member 66 includes a porous ceramics. Consequently, all over the surface of the tape member 12 may be reliably and uniformly sucked and held by the adsorbing member 66. Thereby, slack may be prevented from being generated in the tape member 12.

Furthermore, the tape member 12 is clamped by the clamping member 70. Thereby, even when vacuum suction of the inside of the vacuum chamber 50 is performed to cause a state in which there is no difference in pressure between the front surface and the back one of the tape member 12, the tape member 12 may be prevented from falling from the adsorbing member 66. Thereby, the tape member 12 may be preferably bonded to the wafer 11.

Moreover, the locking mechanism 80 is provided between the cover body section 60 and the main body section 20. When opening of the cover body section 60 is locked using the above locking mechanism 80, the cover body section 60 may be prevented from being raised for opening even when the inside of the vacuum chamber 50 is pressurized. Thereby, the vacuum chamber 50 may be sealed from the outside to continue the pressurized state.

Furthermore, as the controlling device 90 is connected to the vacuum pump 36, the first to third valve members 37, 41, and 44, the vacuum gage 45, and the sensor 46, the device 90 may control these components. Especially, the controlling device 90 makes the vacuum pump 36 operate for vacuum suction of the chamber 50 and the air introducing section 51, and, after the above vacuum suction, makes the second valve member 41 operate to the air introducing side for introducing the air into the air introducing section 51. Thereby, the rubber sheet 25 may be expanded toward the vacuum chamber 50, and, using expansion of the rubber sheet 25 from which slack is removed, the tape member 12 may be surely bonded to the upper surface of the wafer 11.

Moreover, the controlling device 90 switches the first valve member 37 to the air introducing side, and, at the same time, the second valve member 41 to the vacuum suction side for exhausting of the air introducing section 51 in the first place, when vacuum suction of the vacuum chamber 50 and the air introducing section 51 is performed. Consequently, the pressure of the air introducing section 51 is lower than that of the vacuum chamber 50 at first. Accordingly, the rubber sheet 25 is pressed against the mounting section 22b, and is prevented from being expanded toward the side of the vacuum chamber 50 before anything else. Consequently, the wafer 11 and the tape member 12 may be prevented from being bonded to each other before a stage at which the second valve member 41 is switched to the air introducing side.

Moreover, after the second valve member 41 has been switched to the air introducing side, and the predetermined time has passed, the vacuum pump 36 is rotated backward, and, at the same time, the third valve member 44 is switched to the same side (pressurizing side) as that of vacuum suction according to control of the controlling device 90. Thereby, the air is introduced into the vacuum chamber 50 through the air duct 67 in a pressurized state, and the tape member 12 is pressed against the wafer 11. Thereby, the bonding property (adhesive property) of the tape member 12 to the wafer 11 may be improved, and the tape member 12 may be prevented from easily peeling off from the wafer 11.

Though one embodiment according to the present invention has been explained as described above, various modifications may be made to carry out the present invention. Hereinafter, the above modifications will be described.

According to the above-described embodiment, the wafer 11 has been mounted on the rubber sheet 25. However, there may be applied another configuration in which for example, a sheet-like resin member is mounted on the upper surface of the above rubber sheet 25, and a work piece is mounted on the upper portion of the above sheet-like member. According to the above configuration, attachment of dust and dirt on a work piece may be prevented, wherein the attachment is caused by rubbing of the rubber sheet 25, and the number of cleaning steps and the like using a post cleaning processing device may be reduced.

Moreover, the seal ring 23 has been installed in the main-body top-surface section 22 in the above-described embodiment. However, the seal ring 23 may be installed on the side of the cover body section 60. According to the above configuration, the ring applied section is provided in the main-body top-surface section 22.

In addition, the above-described embodiment has explained that the rubber sheet 25 is used as an elastic sheet member. However, the elastic sheet member is not limited to the rubber sheet 25, and a resin material such as elastomer resin, other than a rubber material, may be applied. Moreover, the above-described embodiment has explained that the pressing ring 26 is used as a holding member. However, the holding member is not limited to the pressing ring 26, and a material with a bonding property, such as a bonding agent which is spread over the inside diameter section 22a, may be used as the holding member. Moreover, the shape of the holding member is not limited to the ring-like shape, and various kinds of shapes such as a ring shape forming a polygon in the outer diameter may be adopted.

Moreover, the above-described embodiment has explained a case in which the tape holding unit has the adsorbing member 66, and the tape member 12 is adsorbed and held by the above adsorbing member 66. However, a configuration in which the tape member 12 is held is not limited to the above case. There may be adopted, for example, a configuration in which the tape member 12 is stretched using a ring-like tape frame.

Moreover, though, in order to adsorb and hold the tape member 12, the present embodiment uses the adsorbing member 66 made of a porous ceramics as a material, any material may be applied as the adsorbing member, as long as the material is a porous body. Another example of the porous body includes a sponge body.

Moreover, a controlling unit with a configuration in which control conditions are set beforehand may be applied, or a configuration in which control conditions may be arbitrarily set by the side of the operator may be applied. Furthermore, any configurations, regardless of the shape, in which a space between the main body section 20 and the cover body section 60 is made airtight by blocking may be applied as the sealing member.

Moreover, a glass substrate such as liquid crystals, a special glass material, an organic electroluminescent glass-substrate, and the like, other than the wafer, may be adopted as a work piece. Moreover, though the atmosphere (air) has been introduced after a vacuum state in the above-described embodiment, there may be applied a configuration in which, for example, argon gas, other than air, is introduced to apply pressure.

Moreover, the above-described embodiment has explained a case in which the locking mechanism 80 is used as an opening-and-closing lock unit. However, the opening-and-closing lock unit is not limited to the locking mechanism 80. There may be applied, for example, a configuration in which an inserting hole is provided on the side of the main body section 20, and, at the same time, a pawl section for pivoting under receiving the energizing force of a spring is provided on the side of the cover body section 60 in such a way that the pawl section engages the inserting hole when the cover body section 60 is closed, and opening of the cover body section 60 is locked by engagement of the pawl section in the inserting hole. Moreover, there may be applied a configuration in which the opening-and-closing lock unit is eliminated.

Moreover, the tape member 12 is not limited to those disclosed in the above-described embodiment, and there may be used various kinds of materials, such as a UV-hardening-type tape, a polarizing film, a protective sheet, and a transparent electrode, which may be bonded to the surface of a work piece.

Moreover, in the above-described embodiment, there may be a configuration in which a peeling-off mechanism by which the tape member 12 bonded to the surface of a work piece peels off is provided in the inside of the tape bonding device 10. In this case, for example, a suction holding mechanism as a peeling mechanism for peeling off the tape member 12 may be provided in the inside of the cover body section 60 or the main body section 20, or a mechanism in which the end portion of the tape member 12 is picked up and is peeled off may be provided in the tape bonding device 10. Moreover, when a suction holding mechanism is provided, a configuration in which suction of the above-described vacuum pump 36 is used may be adopted.

By providing the above-described peeling mechanisms, the tape member 12 may be peeled off in the inside of the tape bonding device 10 for vacuum suction. Therefore, dust may be prevented from adhering to the surface of the glass substrate when the tape is peeled off. In the current situation, it is especially difficult to prevent dust from adhering to the surface of a work piece even if the tape member 12 is peeled off in a clean room. But, when the tape bonding device 10 according to the present embodiment is used, dust may be further surely prevented from adhering to a work piece because the tape member 12 is peeled off in a vacuum state.

Moreover, there may be applied a configuration in which after the tape member 12 is separately bonded to the wafer 11 and the glass substrate, a mechanism for cutting the tape member 12 is provided in the inside of the tape bonding device 10.

Moreover, the tape bonding device 10 according to the above-described embodiment is provided with the cover body section 60 for pressurizing. However, the tape bonding device may have a configuration in which the cover body section 60 can be changed for a cover body section without the air duct 67, and the like, and without a function of pressurizing.

Furthermore, the adsorbing member 66 is made of a porous ceramics in the present embodiment. In this case, there may be applied a configuration in which a mechanism for separately heating the porous ceramics is provided, and the above adsorbing member 66 is provided with a heating function like a ceramic heater. In this case, a preferable bonding (adhering) property of the tape member 12 to the wafer 11 may be obtained because the tape member 12 is heated. Consequently, the tape member 12 may be further strongly bonded to the wafer 11.

INDUSTRIAL APPLICABILITY

The device and the method for bonding a tape according to the present invention may be used for processing by which a semiconductor integrated circuit using a wafer is manufactured, and for processing by which a liquid crystal display device using liquid crystal is manufactured. That is, the present invention may be used for a semiconductor manufacturing industry, and the like. Moreover, the present invention may be also used for an industry for manufacturing a display using a glass substrate, and the like.

What is claimed is:

1. A tape bonding device for bonding a tape member to a work piece, wherein said tape bonding device has a main body section, and a cover body section provided reopenable to said main body section, the main body section has:
   a mount member on an upper surface of the main body section on which the work piece is mounted, the mount member being risable;
   a tape holding unit which holds said tape member in a stretched state, and, at the same time, positions said tape member in an upper portion of said work piece mounted on said mount member;
   a sucking unit for vacuum suction of space between said tape member and said work piece, the mount member rising upon the vacuum suction of the space between said tape member and said work piece, the sucking unit including a vacuum pump and an air duct, one end of the air duct being disposed to the space between said tape member and said work piece, and the other end of the air duct connected to the vacuum pump, said cover body section has:
   a concave section which is depressed upward in the blocked state of said cover body section, and, at the same time, the upper bottom surface of said concave section presses downward said work piece and said tape member, which move upward,
   the bonding of the work piece to the tape member sequentially progresses from a center side of the work piece toward a peripheral side of the work piece, and in this bonding mode, the sucking unit continues vacuum suction of the space between said tape member and said work piece using the vacuum pump and the air duct.

2. The tape bonding device according to claim 1, wherein a sensor is provided in a boundary portion between said cover body section and said main body section in order to detect a state in which said cover body section is closed to said main body section, and may transmit a detection signal to a controlling unit, and said controlling unit operates said sucking unit only when said detection signal corresponding to the state in which said cover body section is closed is received from said sensor.

3. The tape bonding device according to claim 1, wherein a heat-hardening-type bonding agent is spread over said tape member, said cover body section is provided with a heating means, and said tape member is heated by said heating means when said tape member is bonded to said work piece.

4. The tape bonding device according to claim 3, wherein a plurality of said heating means are provided in a storage section adjacent to said concave portion on said cover body section, and, at the same time, the plurality of said heating means are radially arranged in said storage section.

* * * * *